(12) United States Patent
Takaki et al.

(10) Patent No.: US 9,646,880 B1
(45) Date of Patent: May 9, 2017

(54) MONOLITHIC THREE DIMENSIONAL MEMORY ARRAYS FORMED USING SACRIFICIAL POLYSILICON PILLARS

(71) Applicant: SanDisk 3D LLC, Milpitas, CA (US)

(72) Inventors: Seje Takaki, Yokkaichi (JP); Teruyuki Mine, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/995,224

(22) Filed: Jan. 14, 2016

(51) Int. Cl.
*H01L 21/768* (2006.01)
*H01L 27/115* (2017.01)
*H01L 21/28* (2006.01)
*H01L 21/283* (2006.01)

(52) U.S. Cl.
CPC ...... *H01L 21/76877* (2013.01); *H01L 27/115* (2013.01); *H01L 21/283* (2013.01); *H01L 21/28273* (2013.01); *H01L 21/28282* (2013.01)

(58) Field of Classification Search
CPC ............ H01L 21/76877; H01L 27/115; H01L 21/28282; H01L 21/28273; H01L 21/8239; H01L 27/11524; H01L 27/11517; H01L 27/1157; H01L 27/11578; H01L 21/283
See application file for complete search history.

(56) References Cited

U.S. PATENT DOCUMENTS

2010/0047995 A1* 2/2010 Apodaca ............. H01L 27/2409
438/429

* cited by examiner

*Primary Examiner* — Thanh T Nguyen
(74) *Attorney, Agent, or Firm* — Vierra Magen Marcus LLP

(57) ABSTRACT

A method is provided for forming a monolithic three-dimensional memory array. The method includes forming a first vertically-oriented polysilicon pillar above a substrate, the first vertically-oriented polysilicon pillar surrounded by a dielectric material, removing the first vertically-oriented polysilicon pillar to form a first void in the dielectric material, and filling the first void with a conductive material to form a first via.

20 Claims, 46 Drawing Sheets

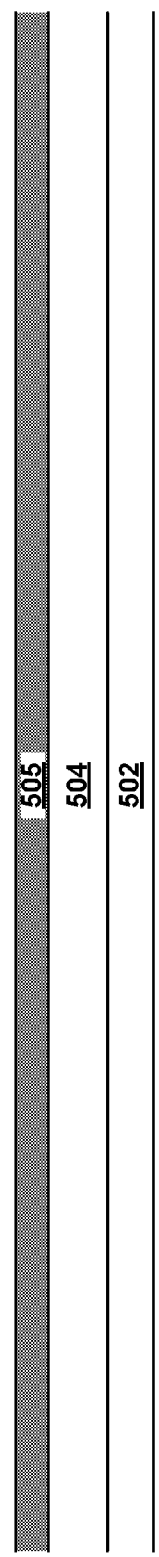

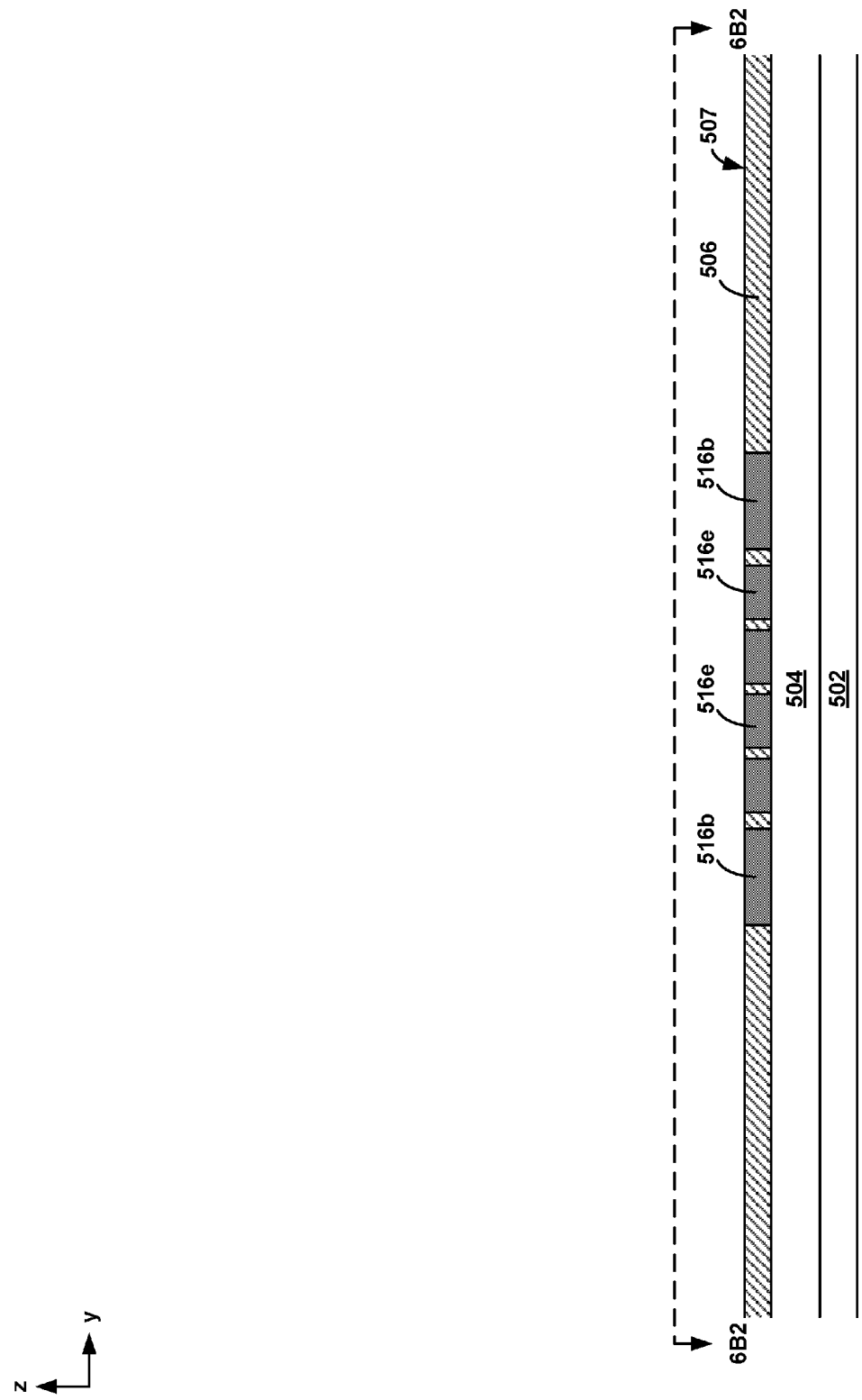

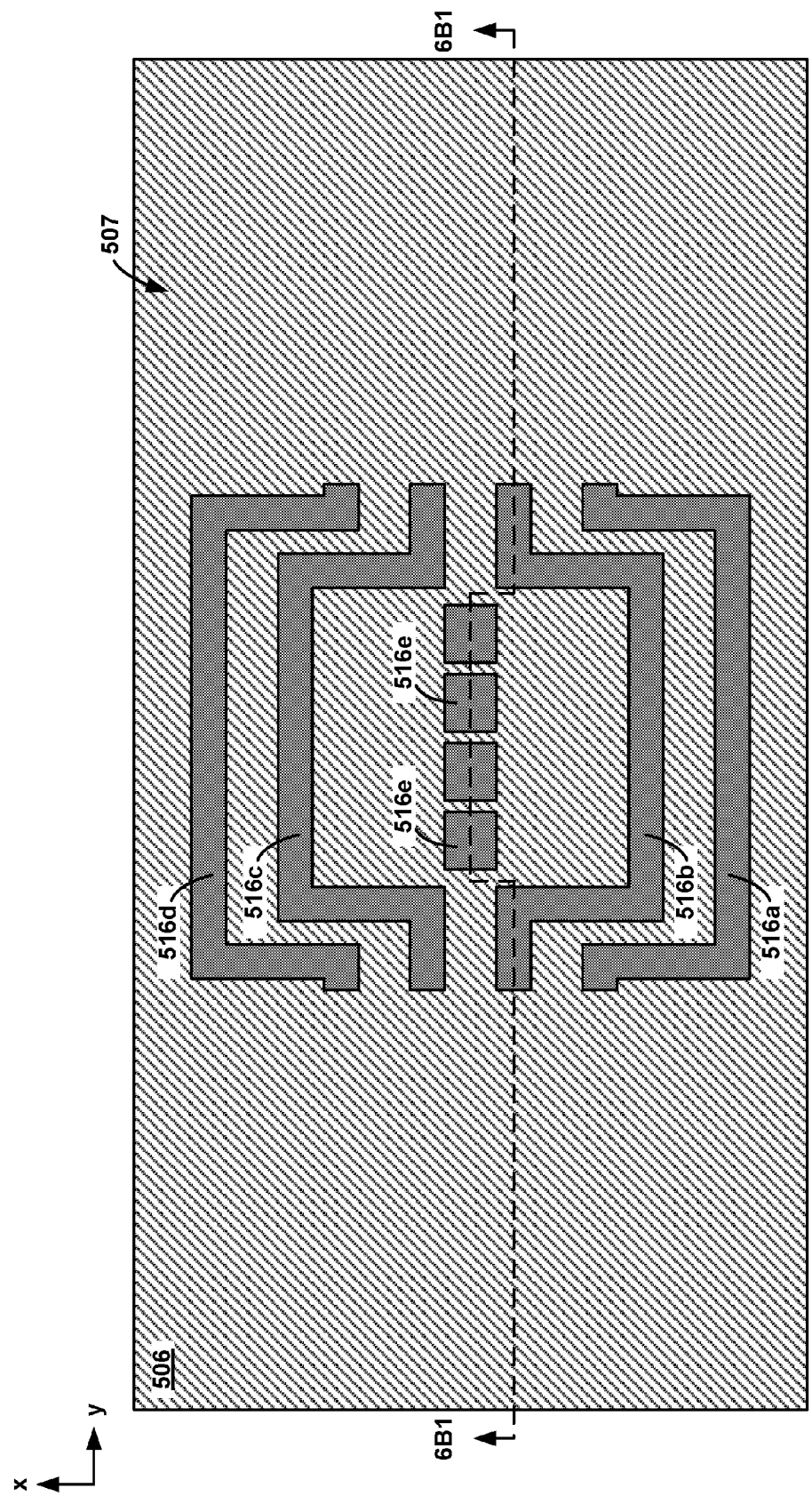
FIG. 6B2

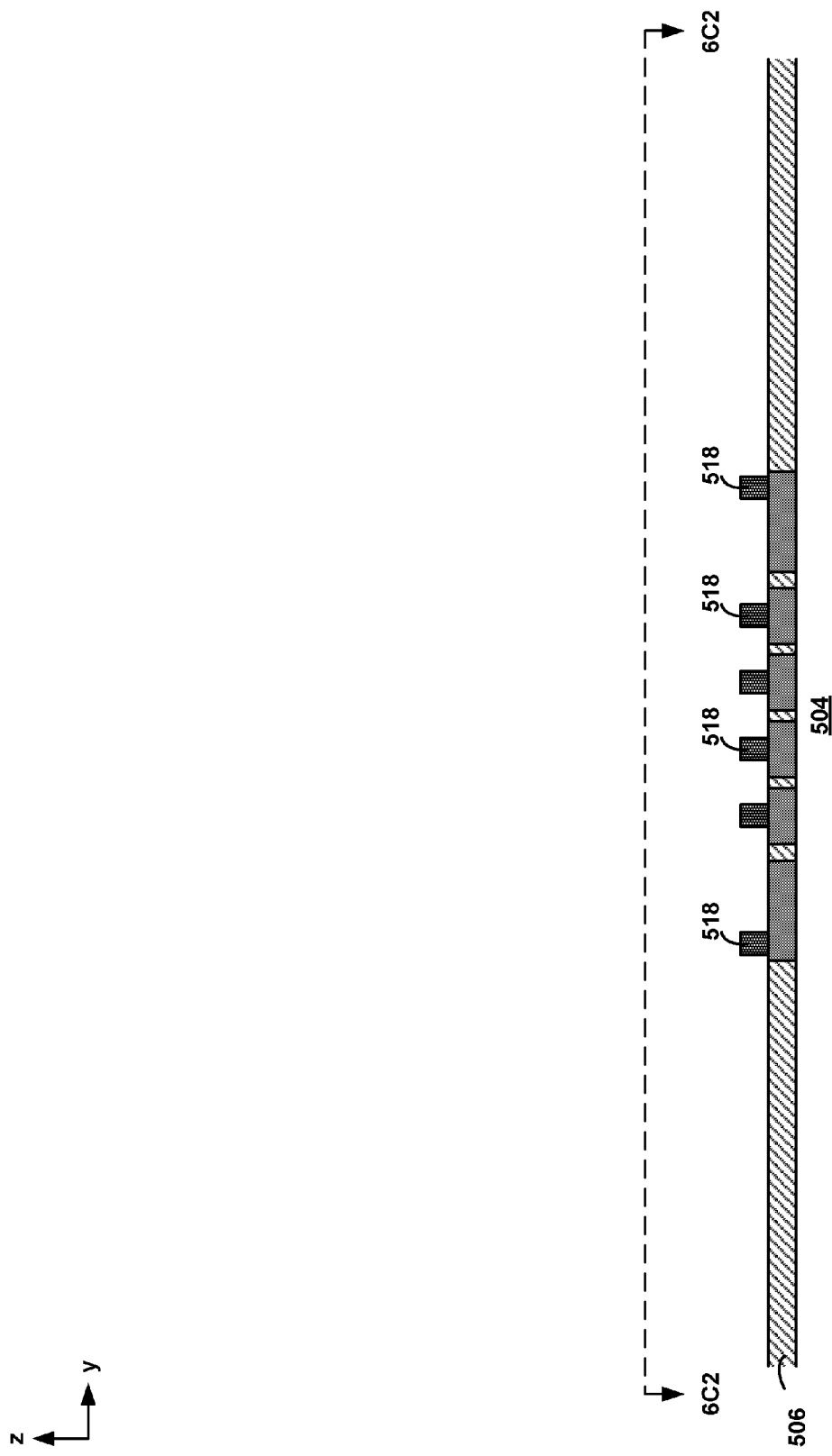

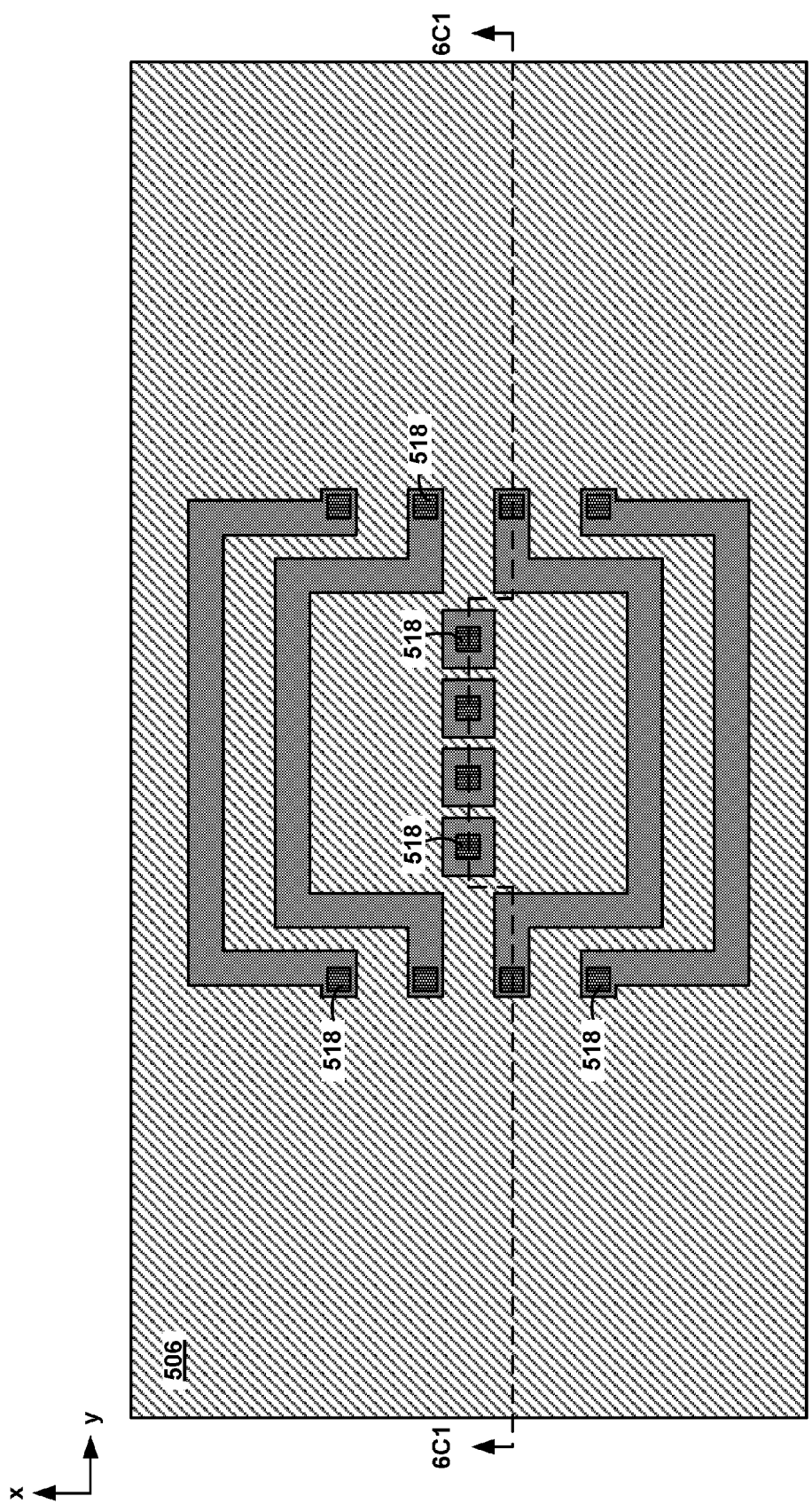
FIG. 6C2

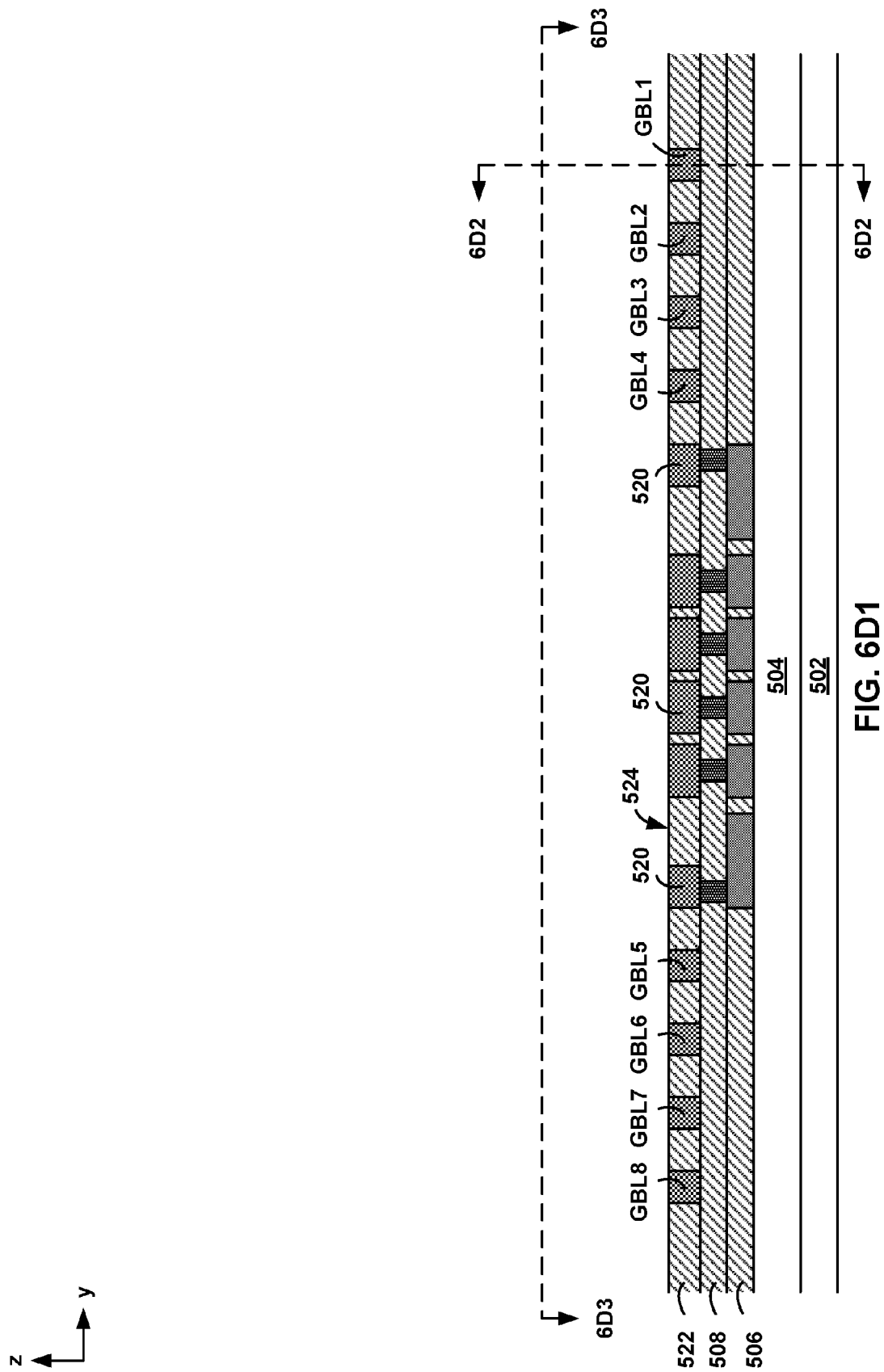
FIG. 6D1

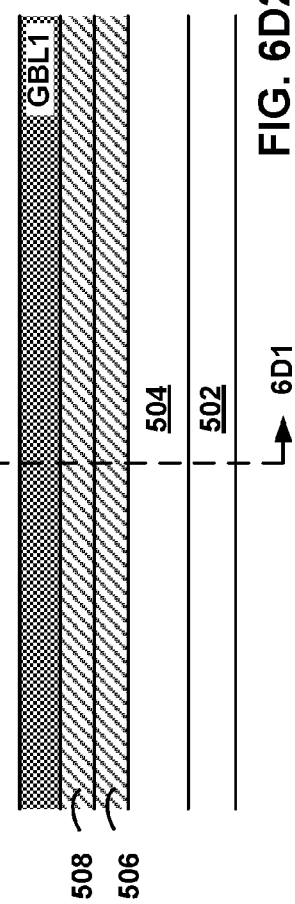
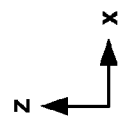
FIG. 6D2

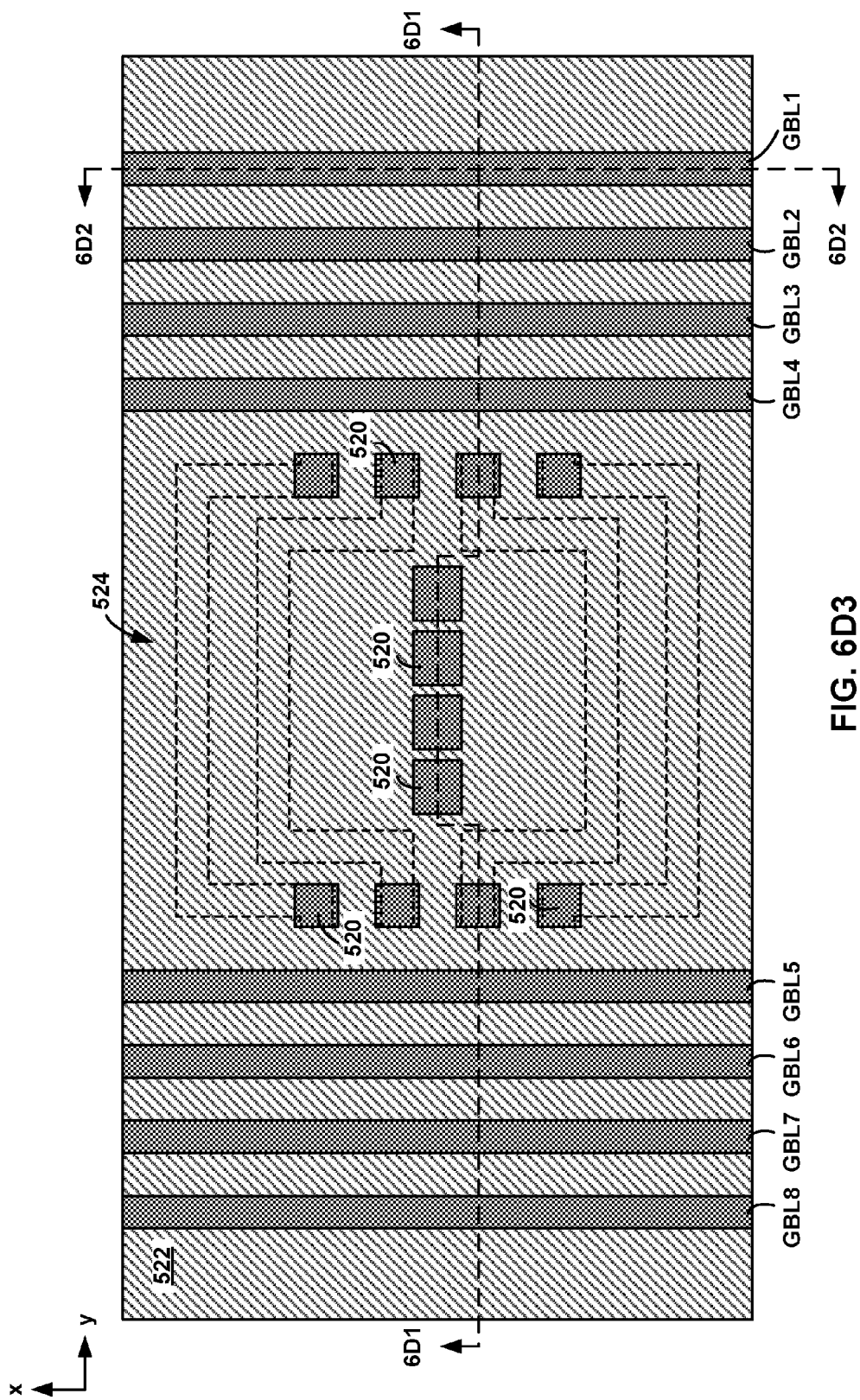
FIG. 6D3

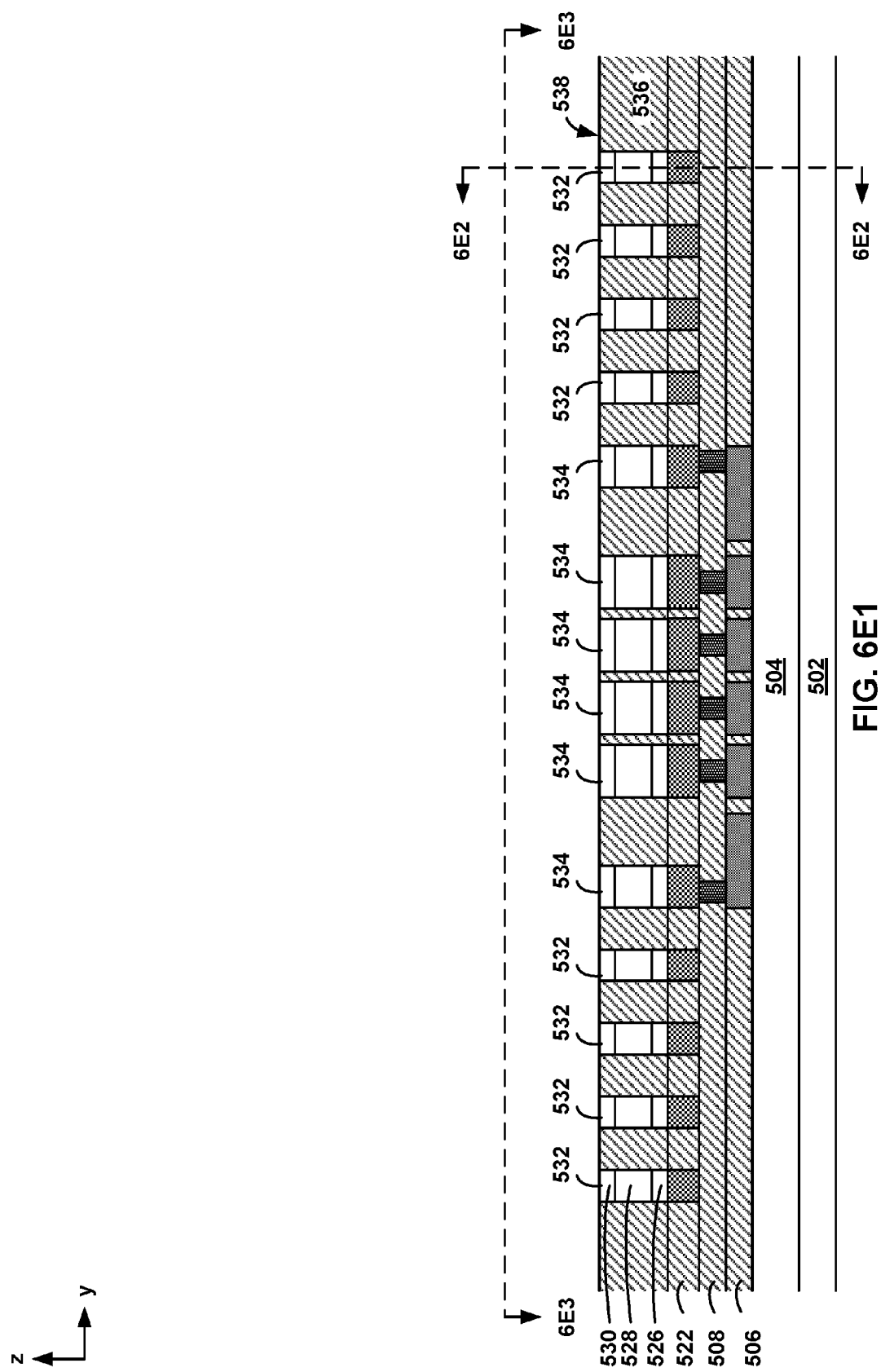

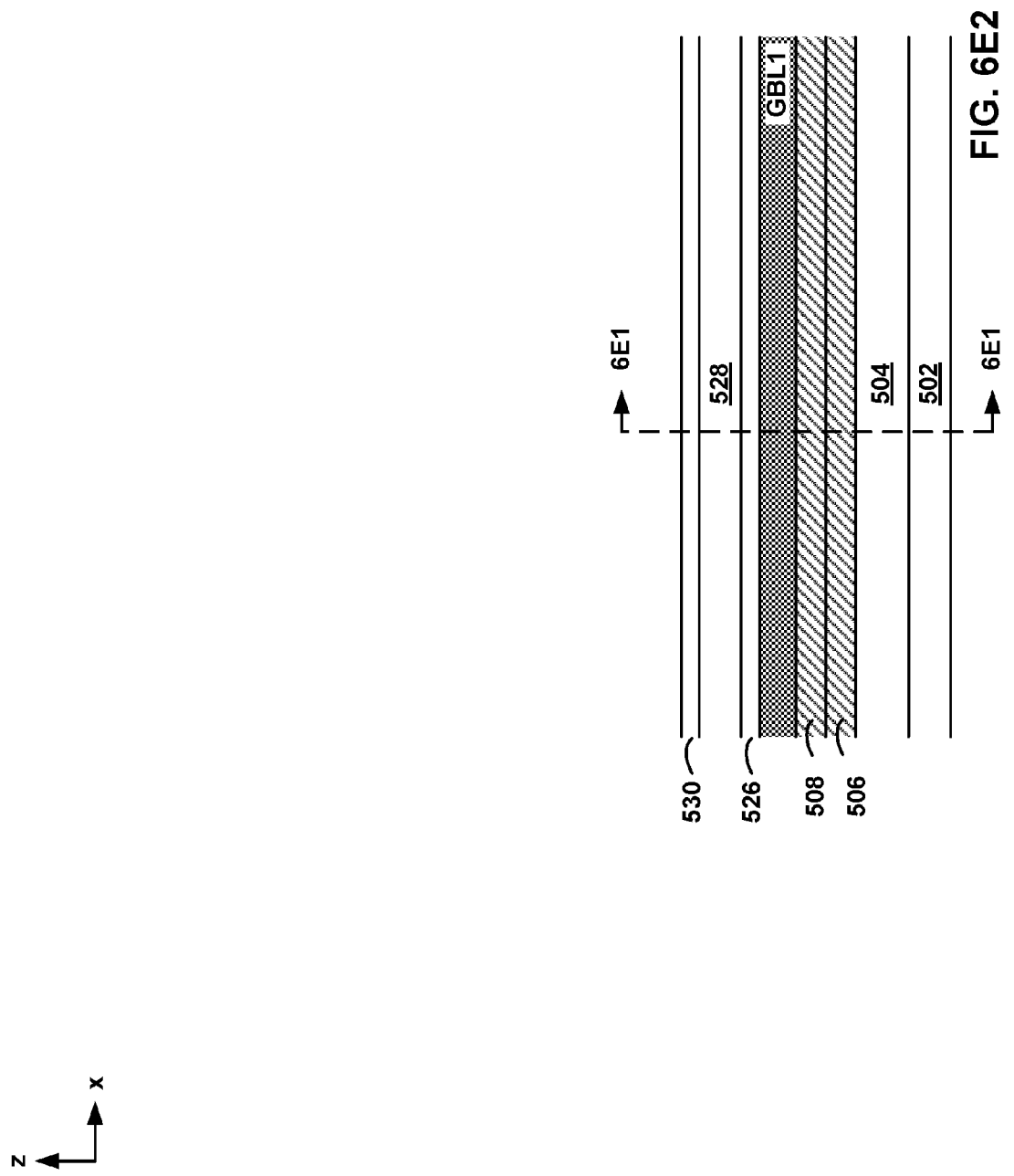

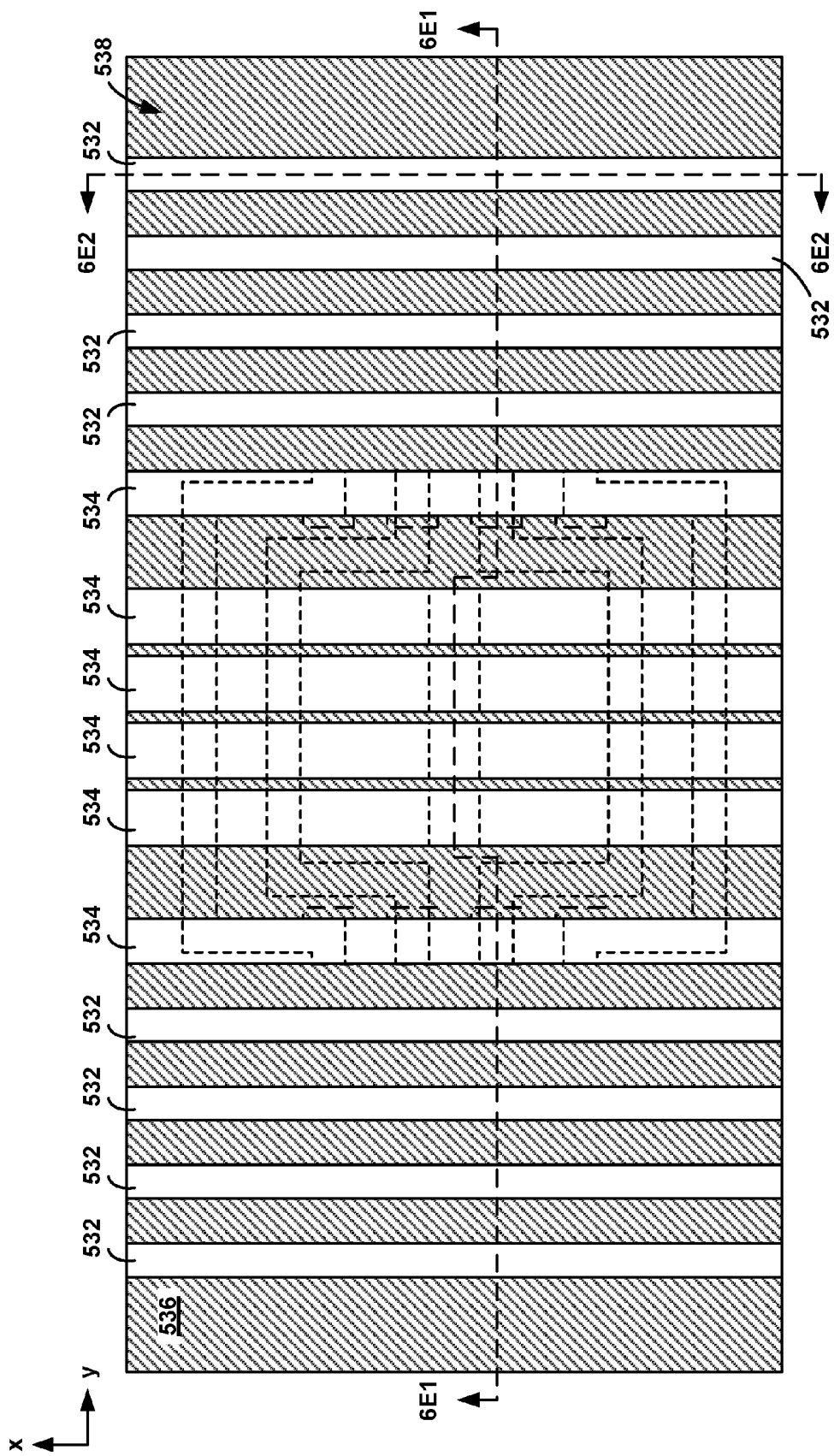
FIG. 6E3

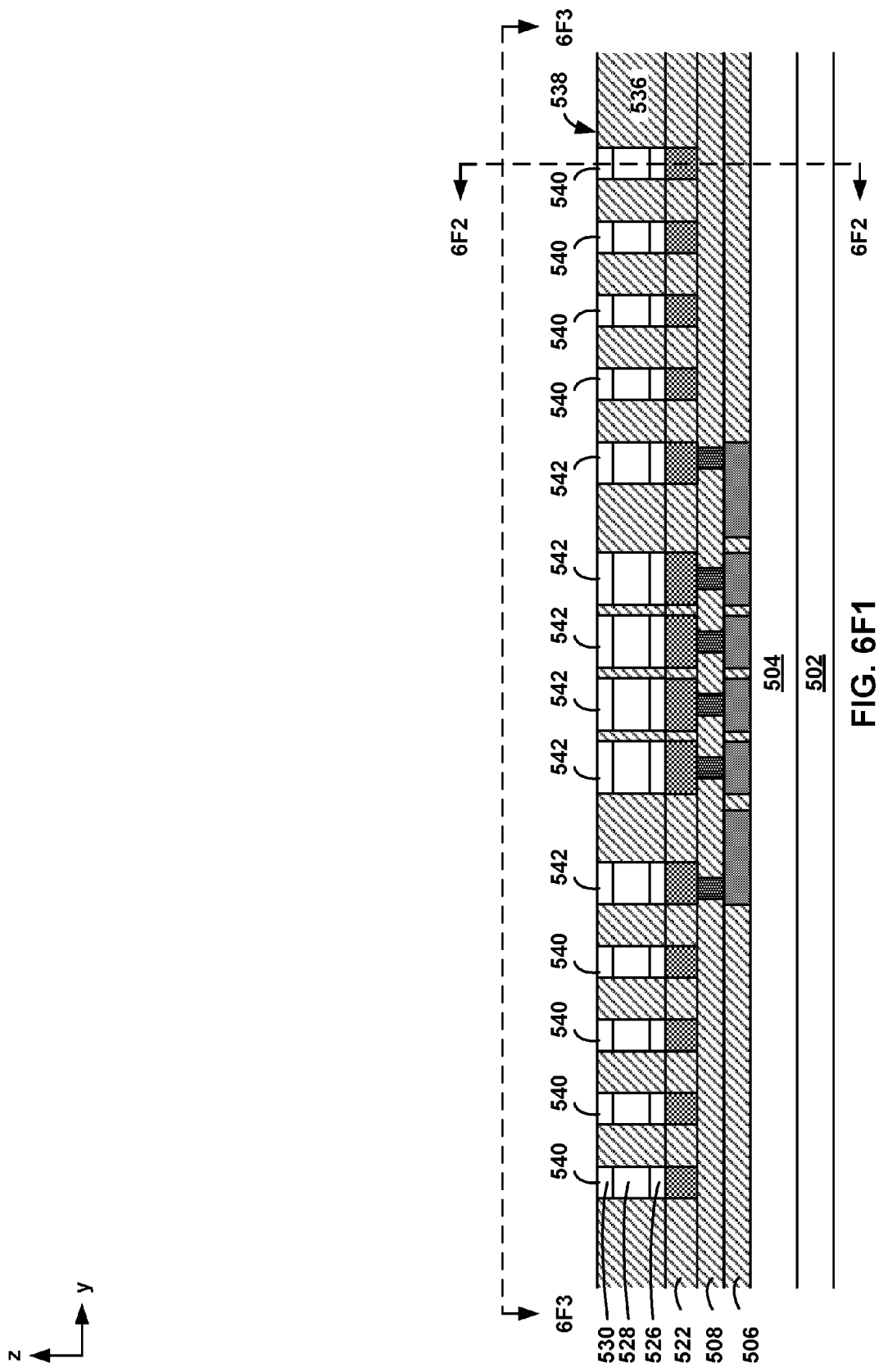

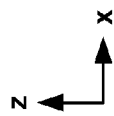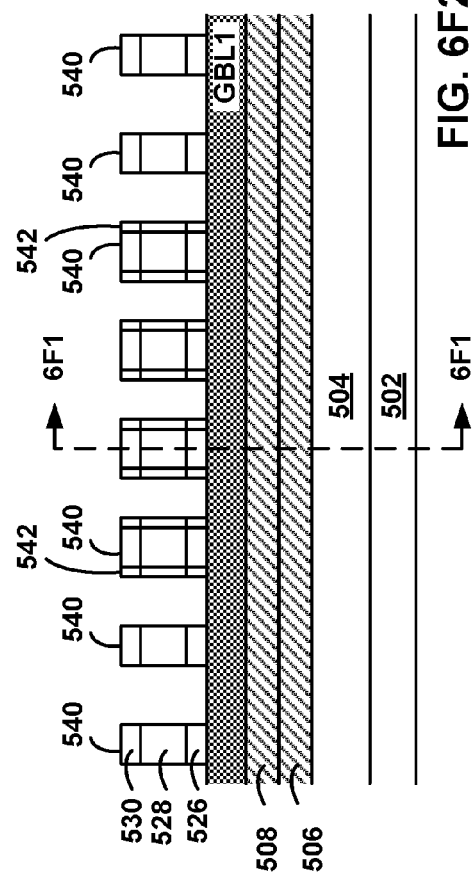

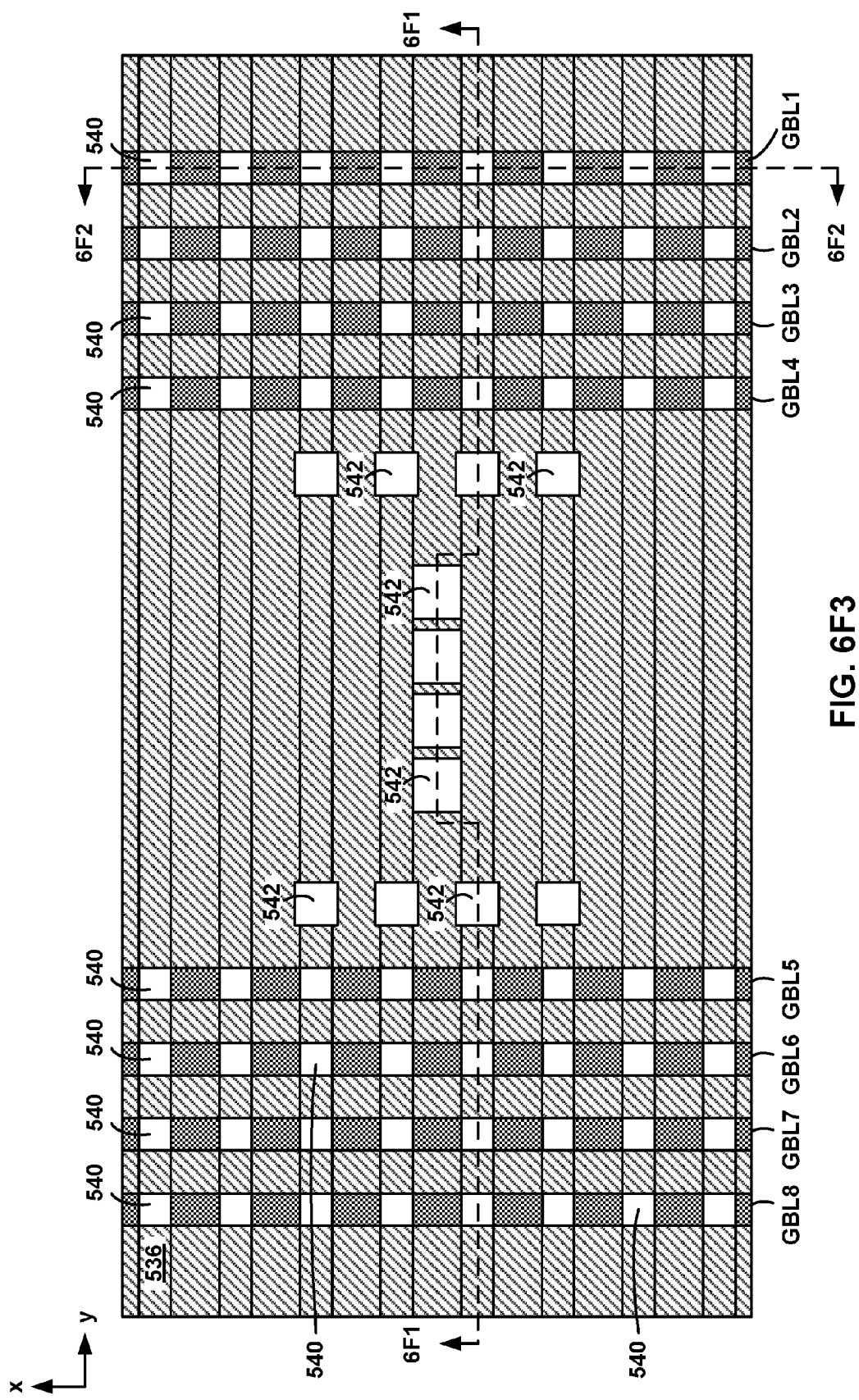
FIG. 6F3

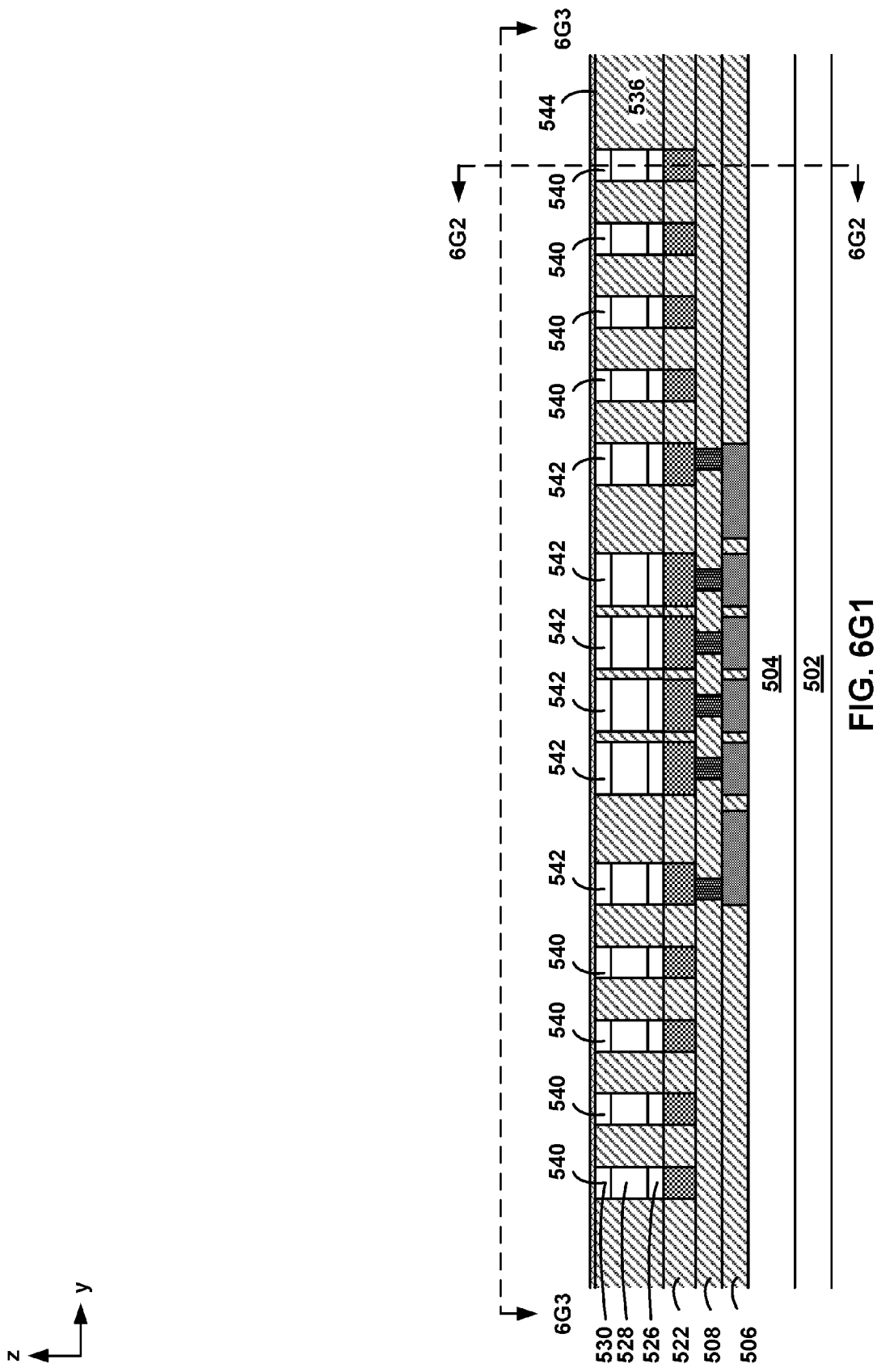

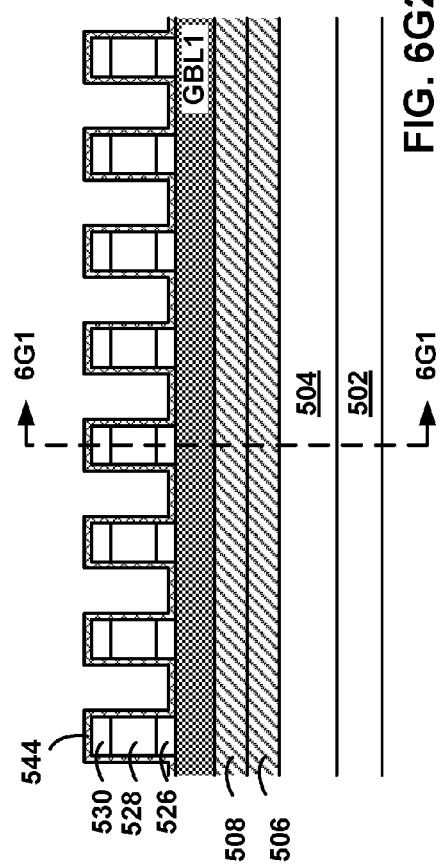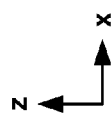

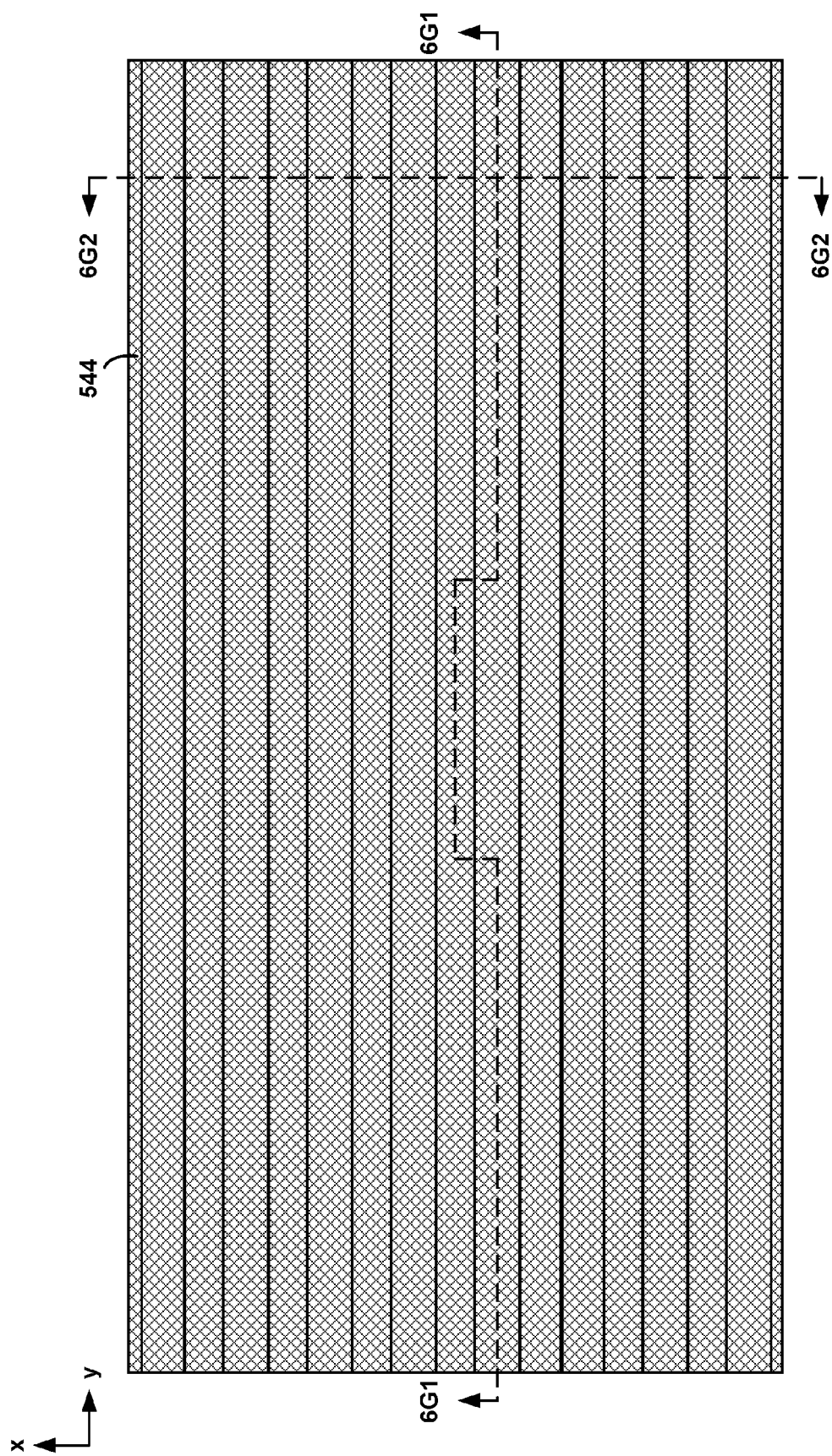
FIG. 6G3

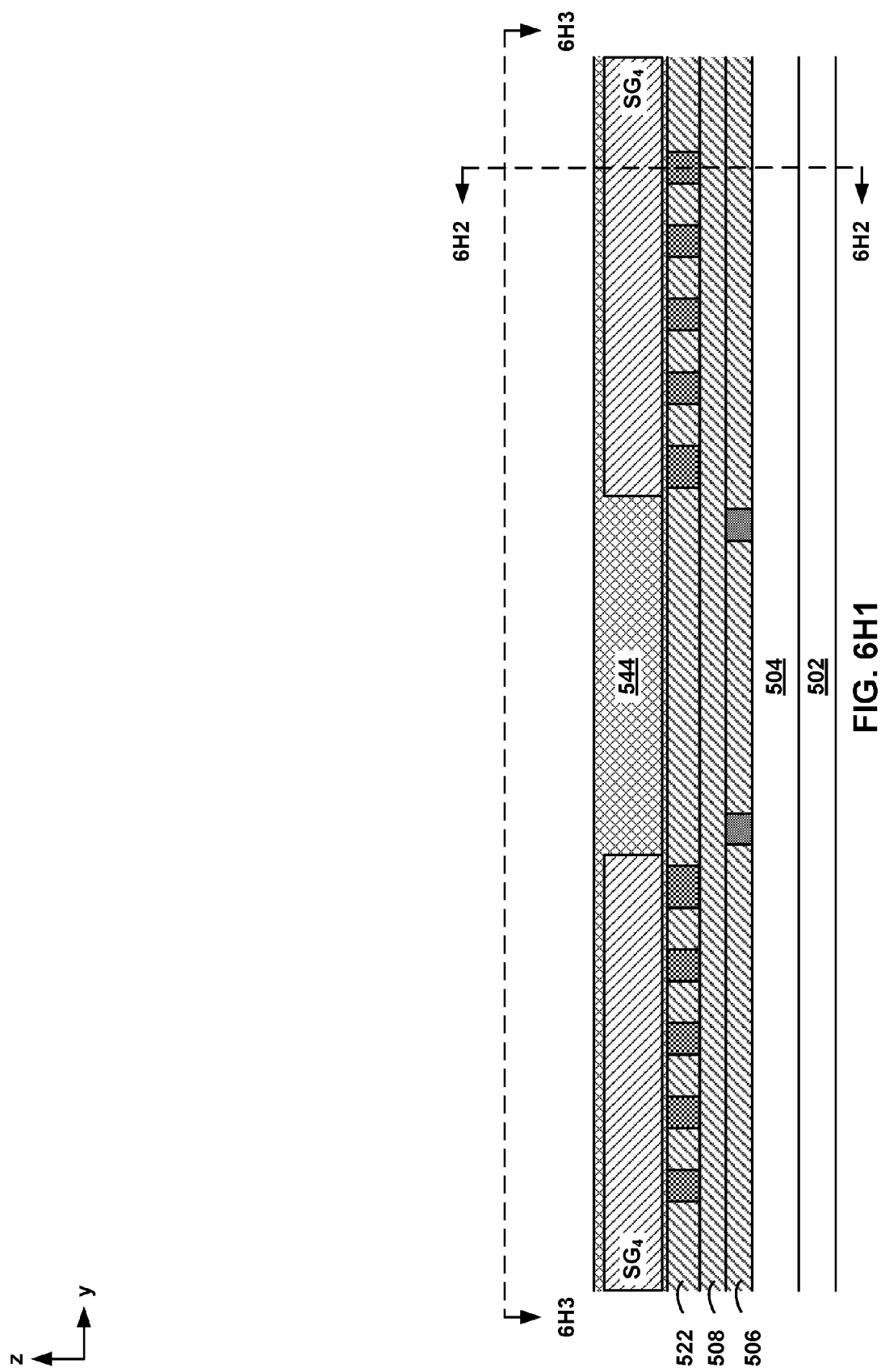

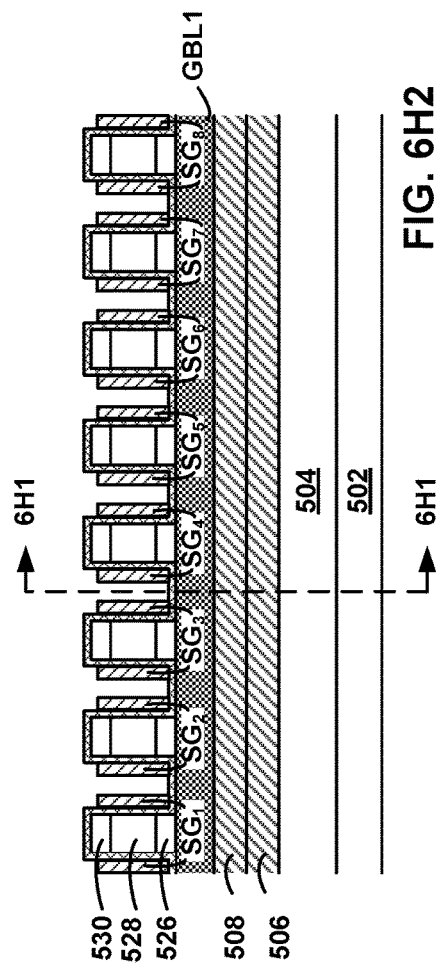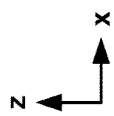

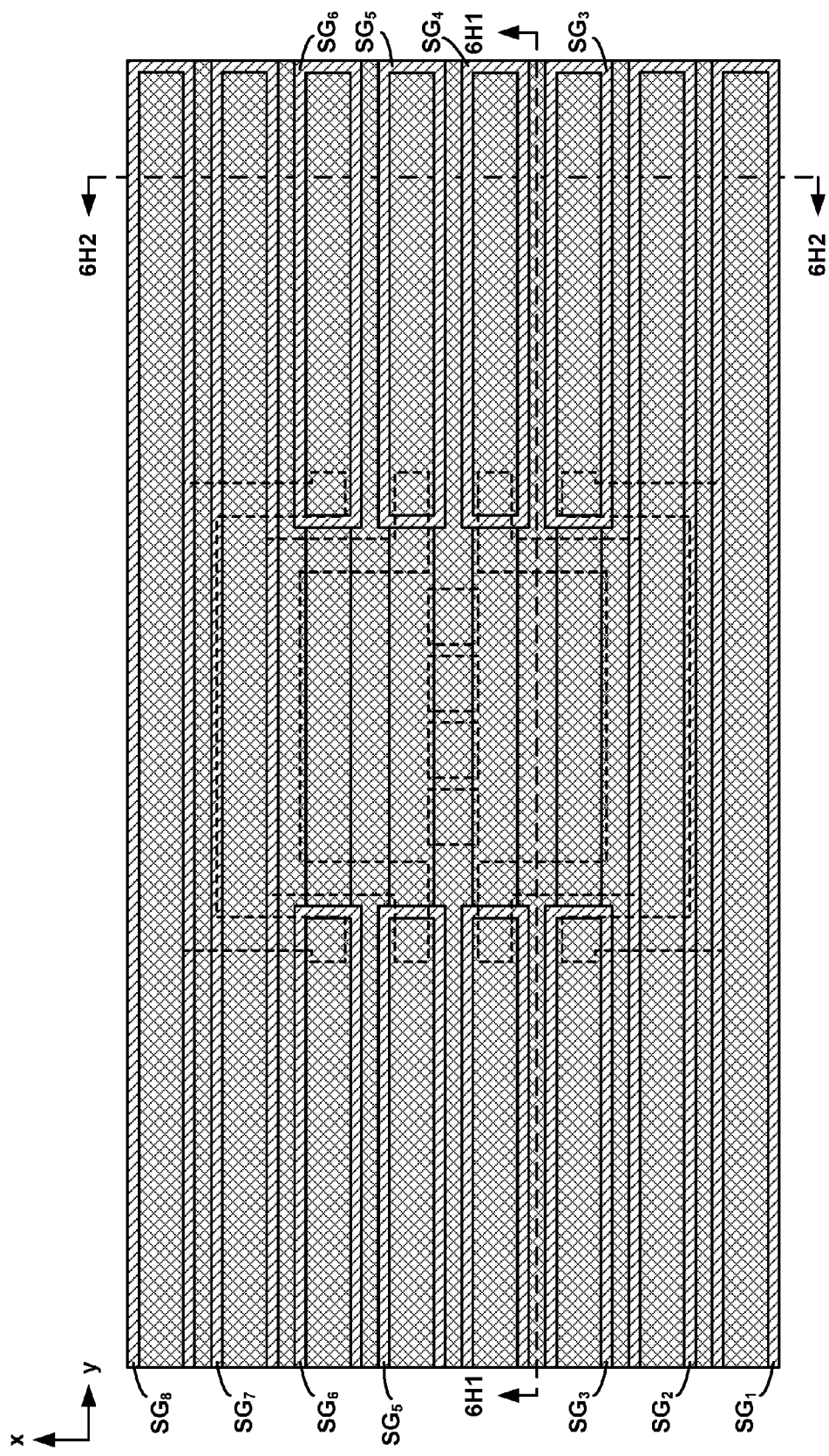
FIG. 6H3

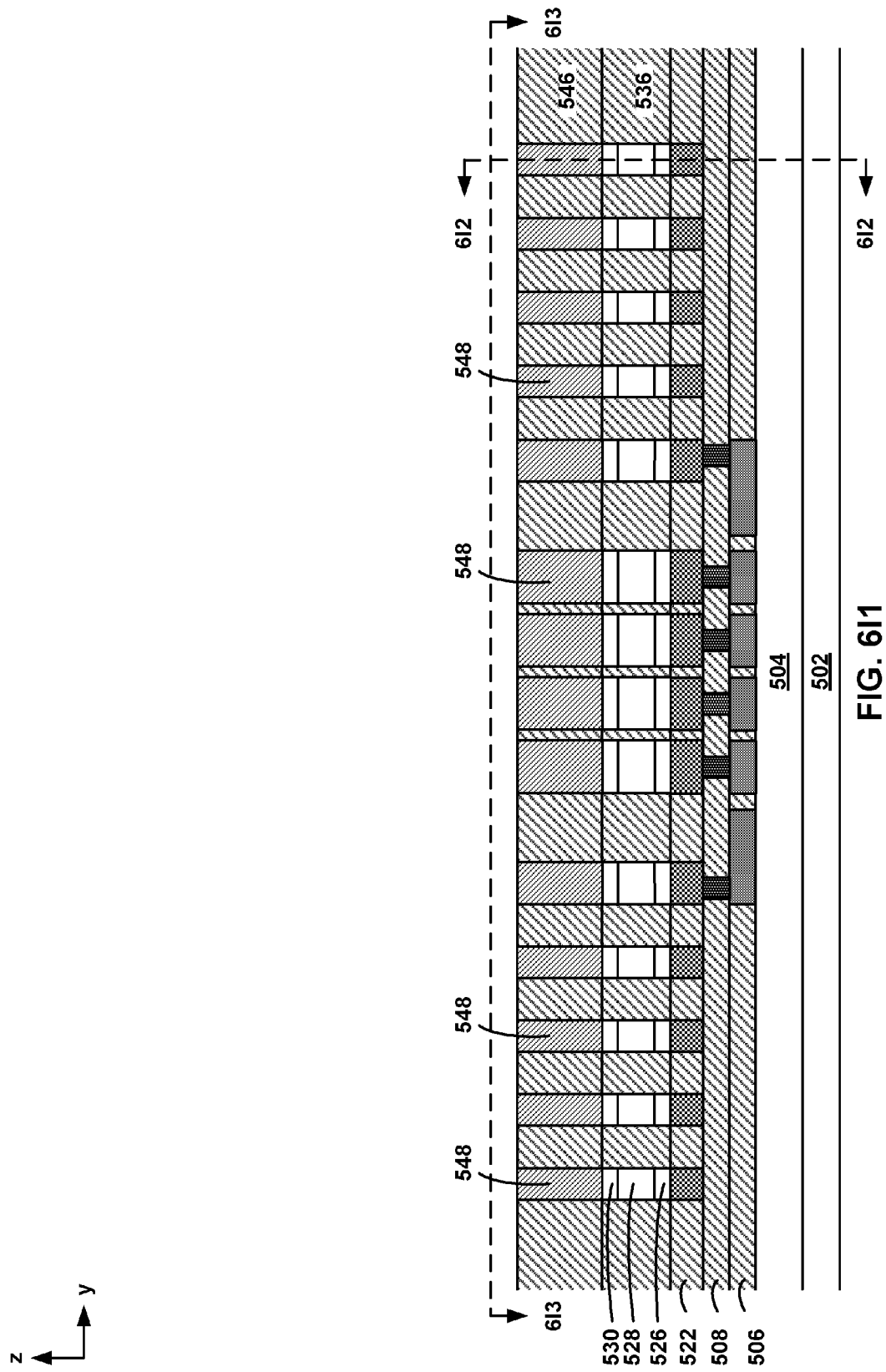
FIG. 6I1

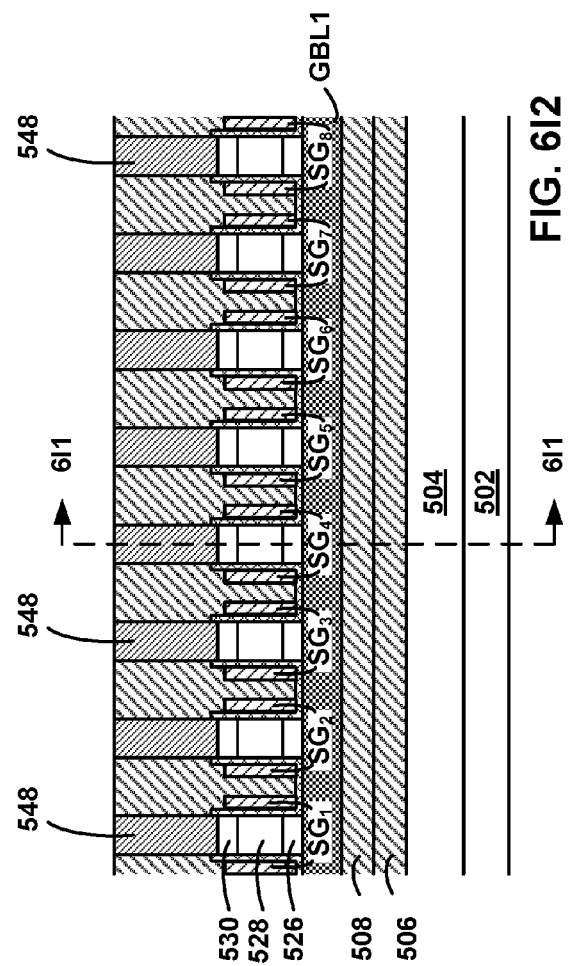
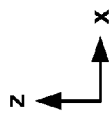
FIG. 612

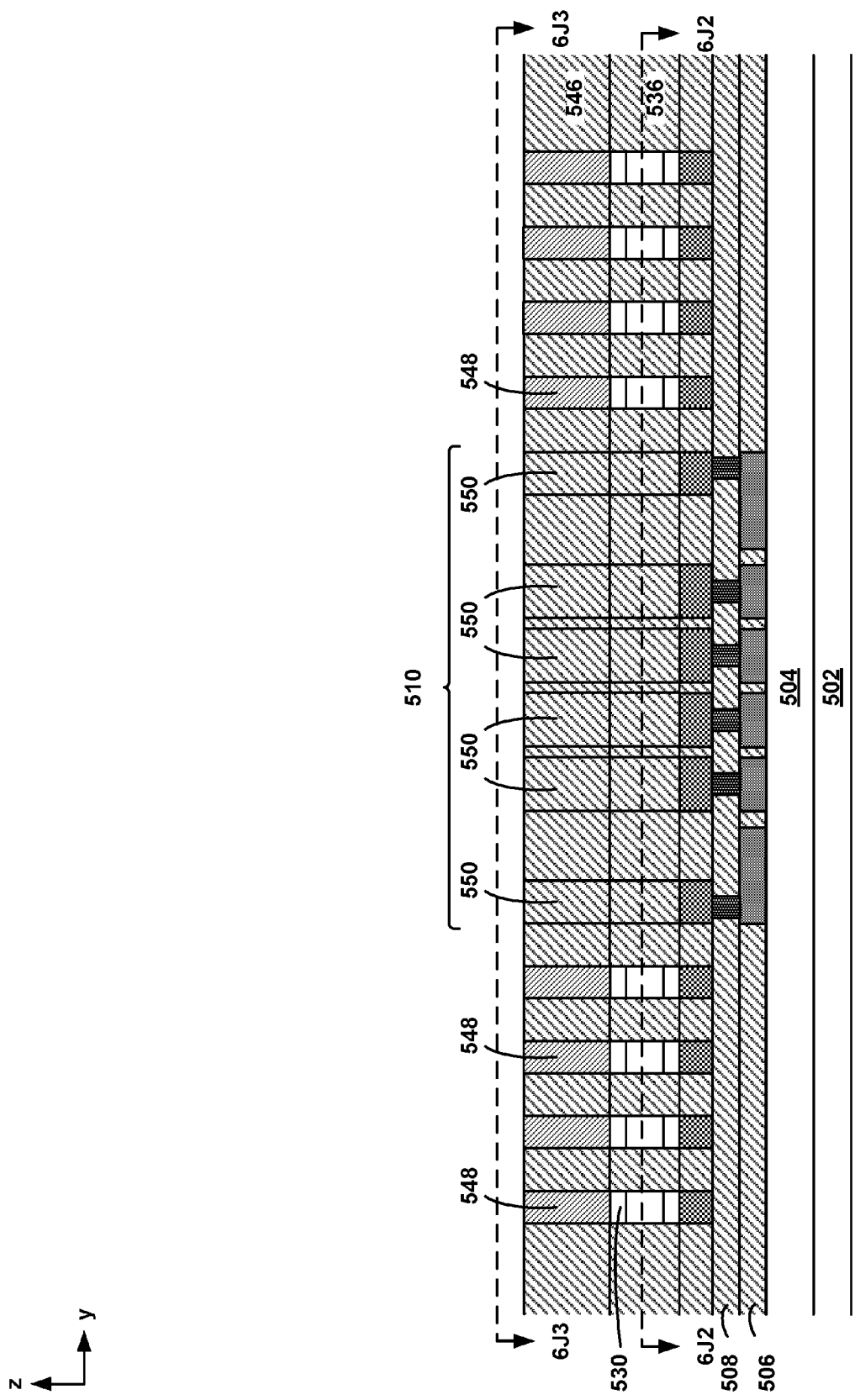

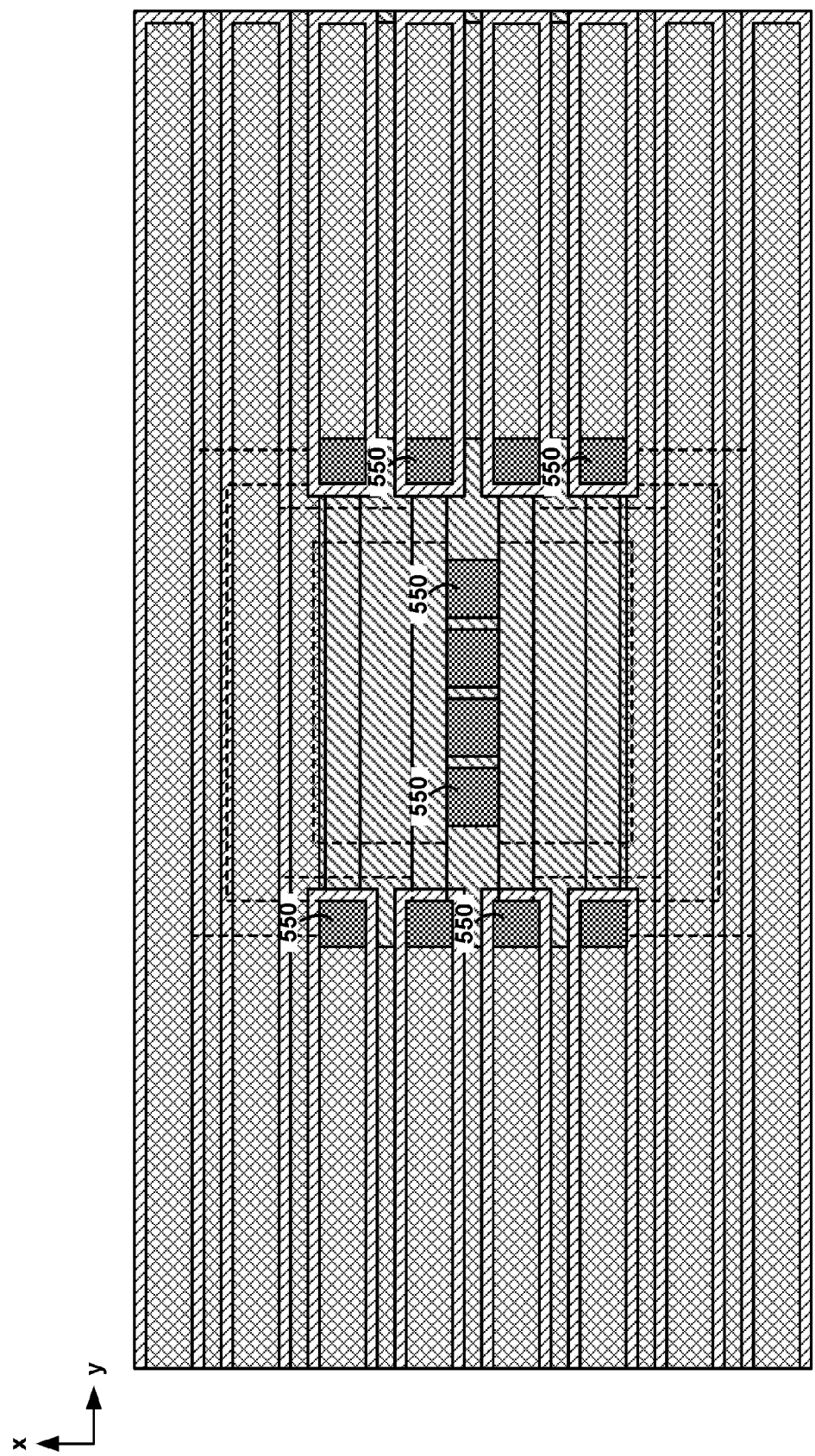
FIG. 6J2

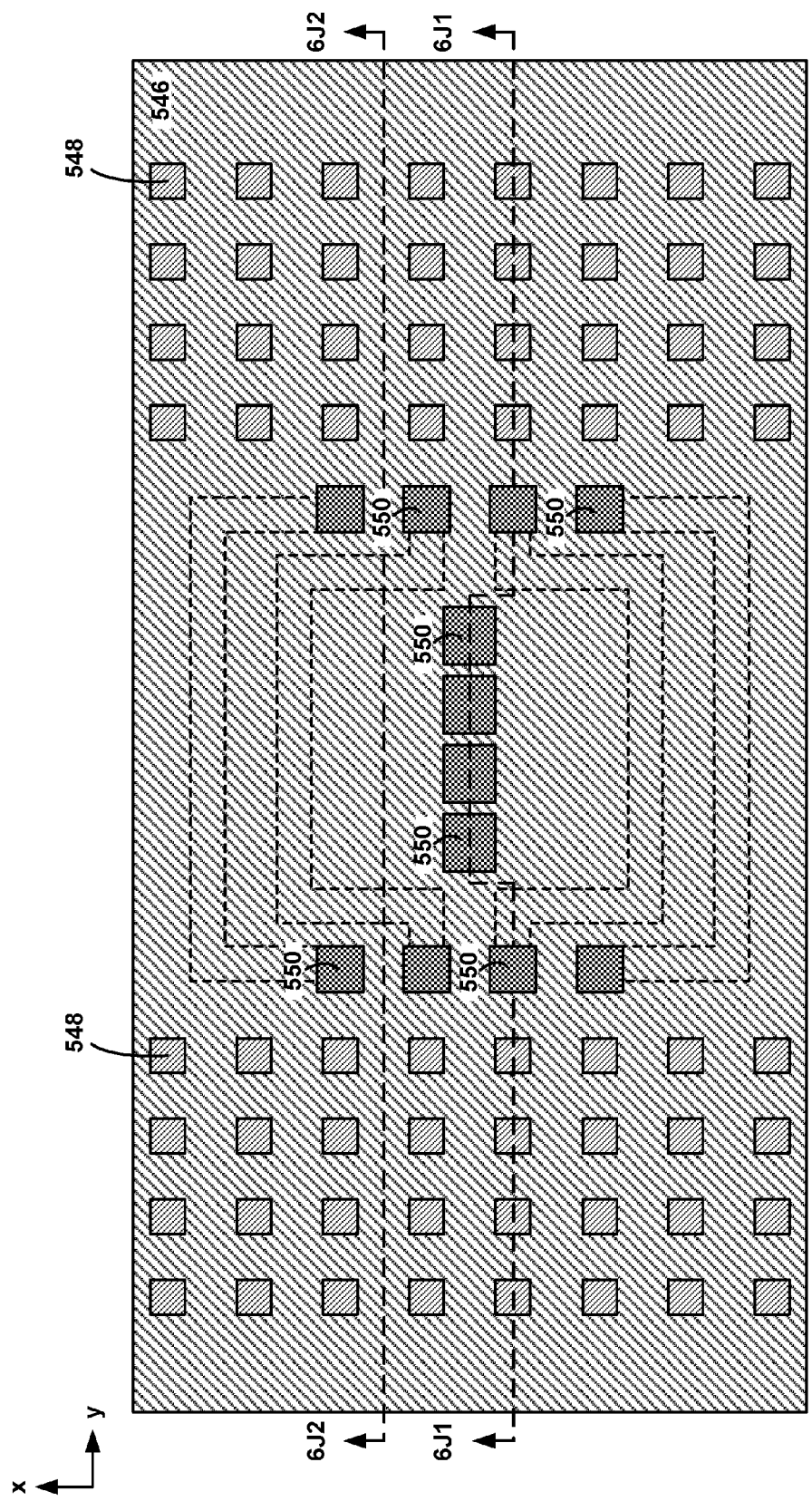
FIG. 6J3

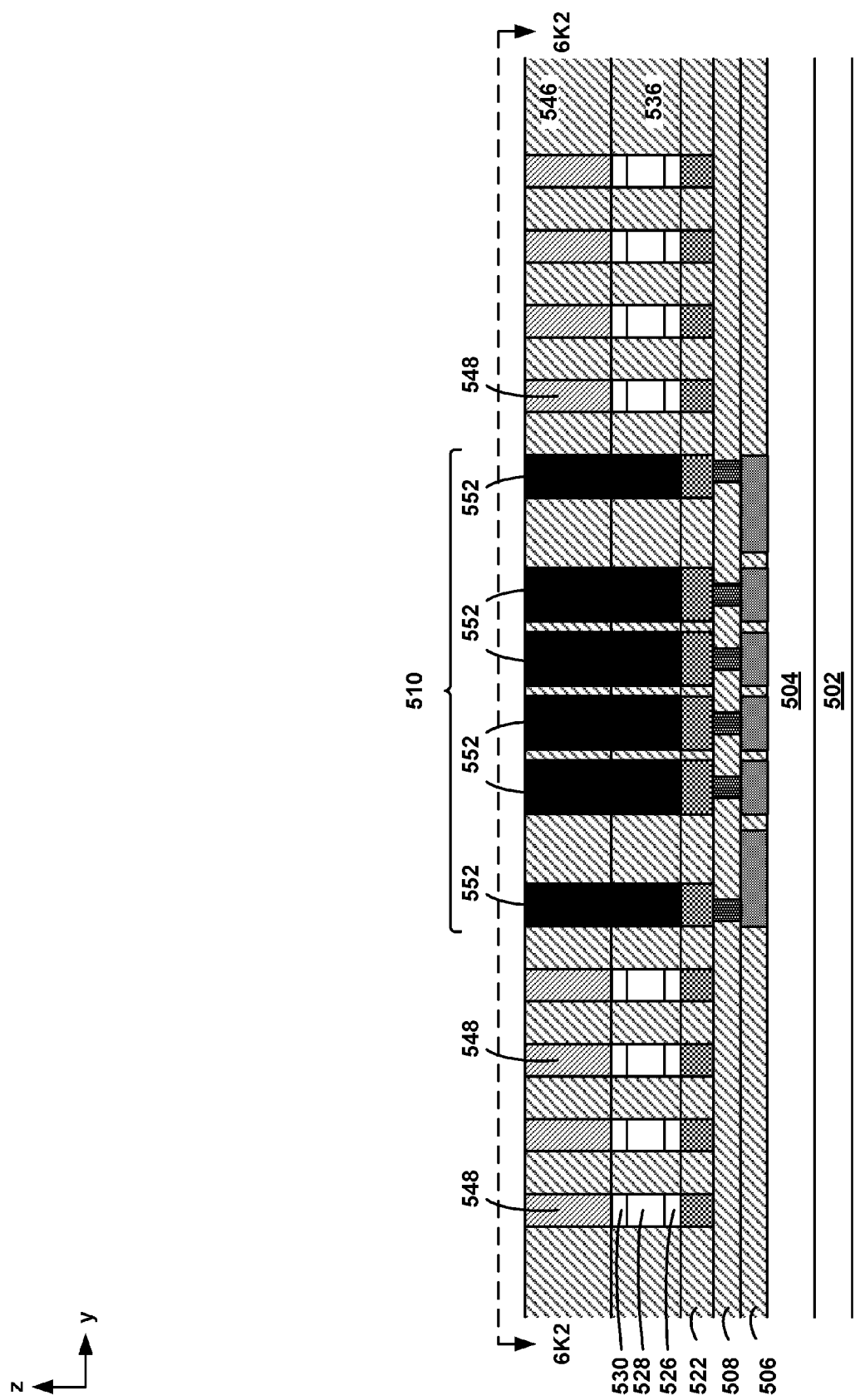
FIG. 6K1

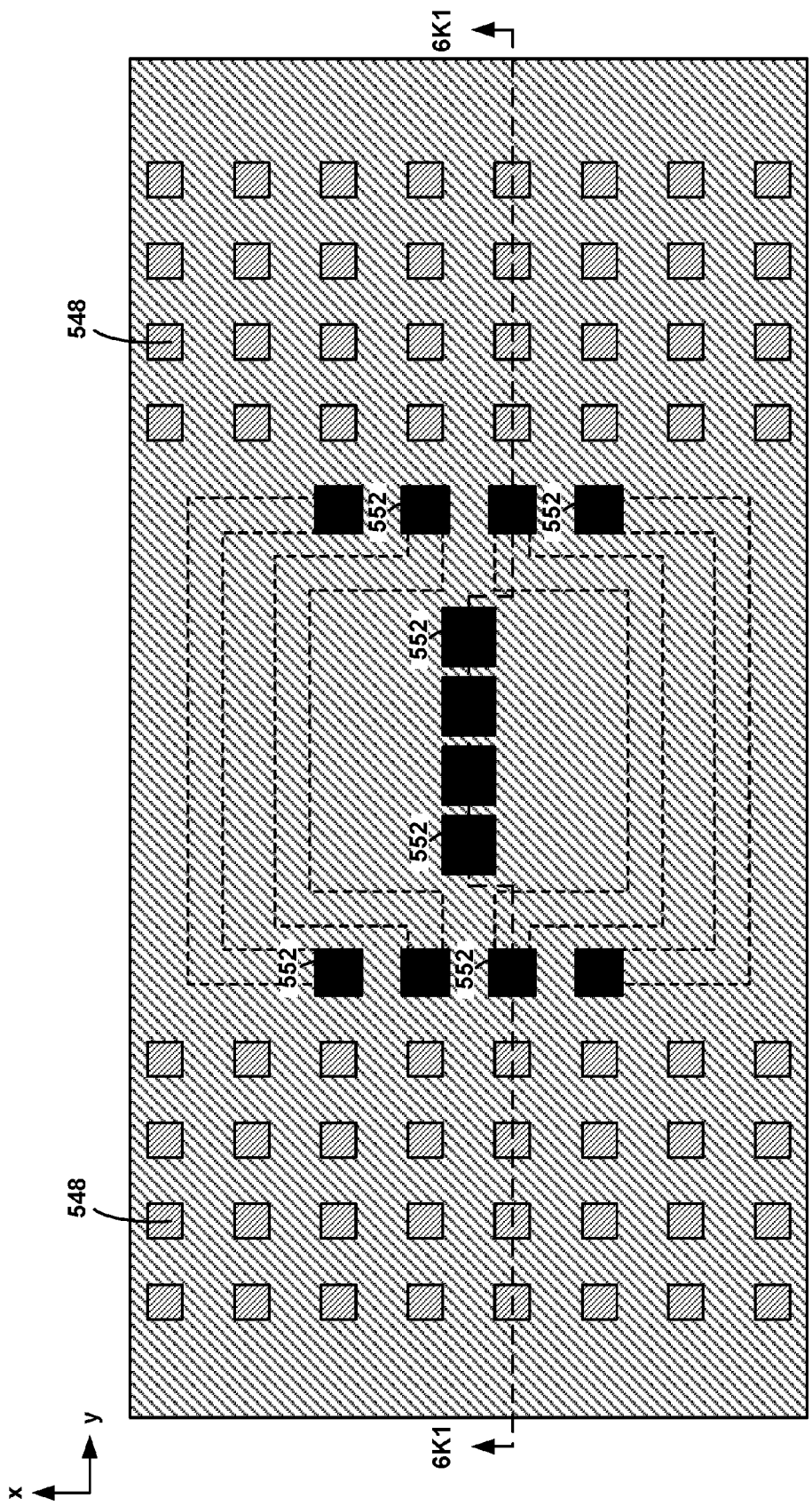
FIG. 6K2

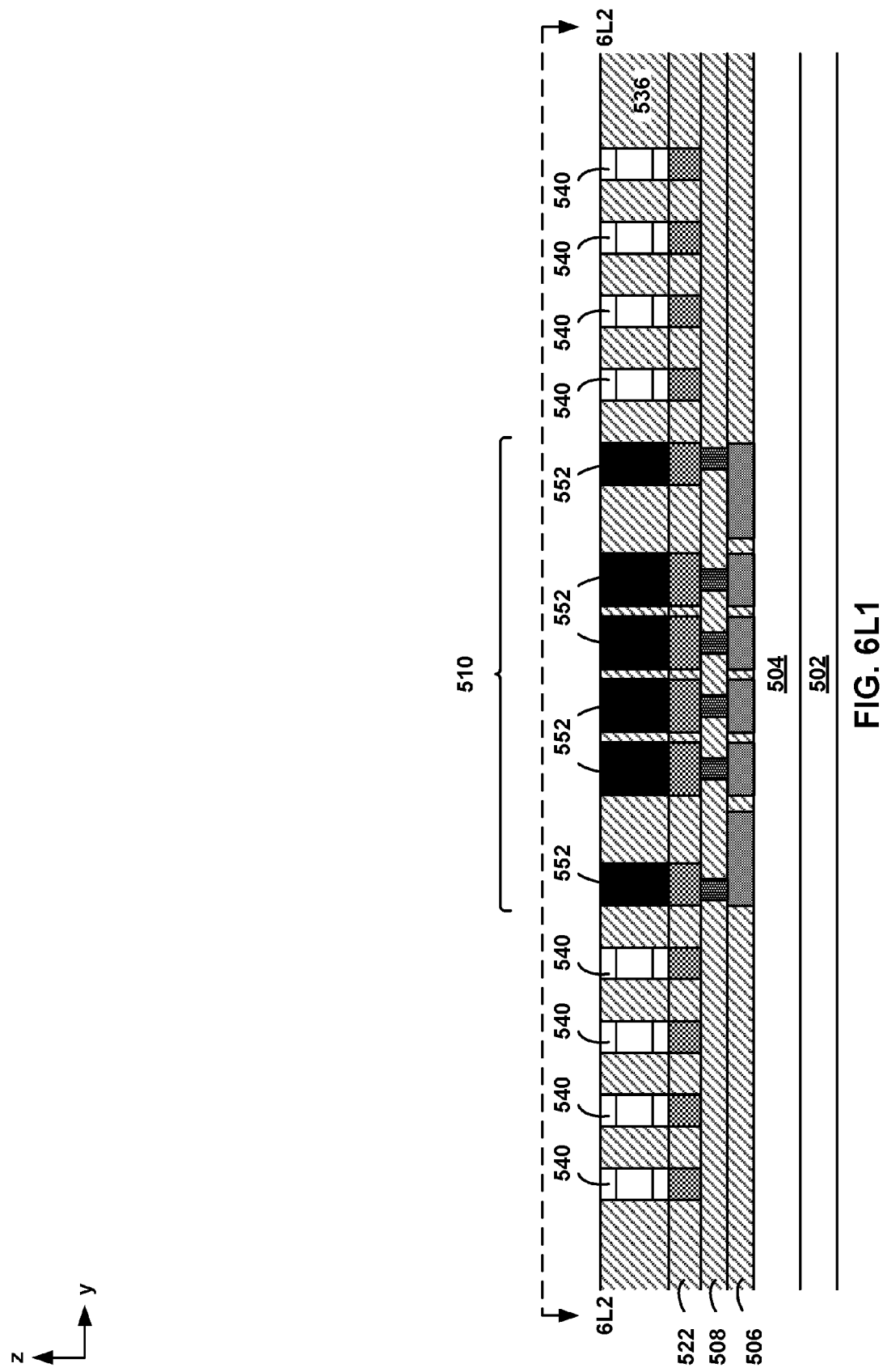

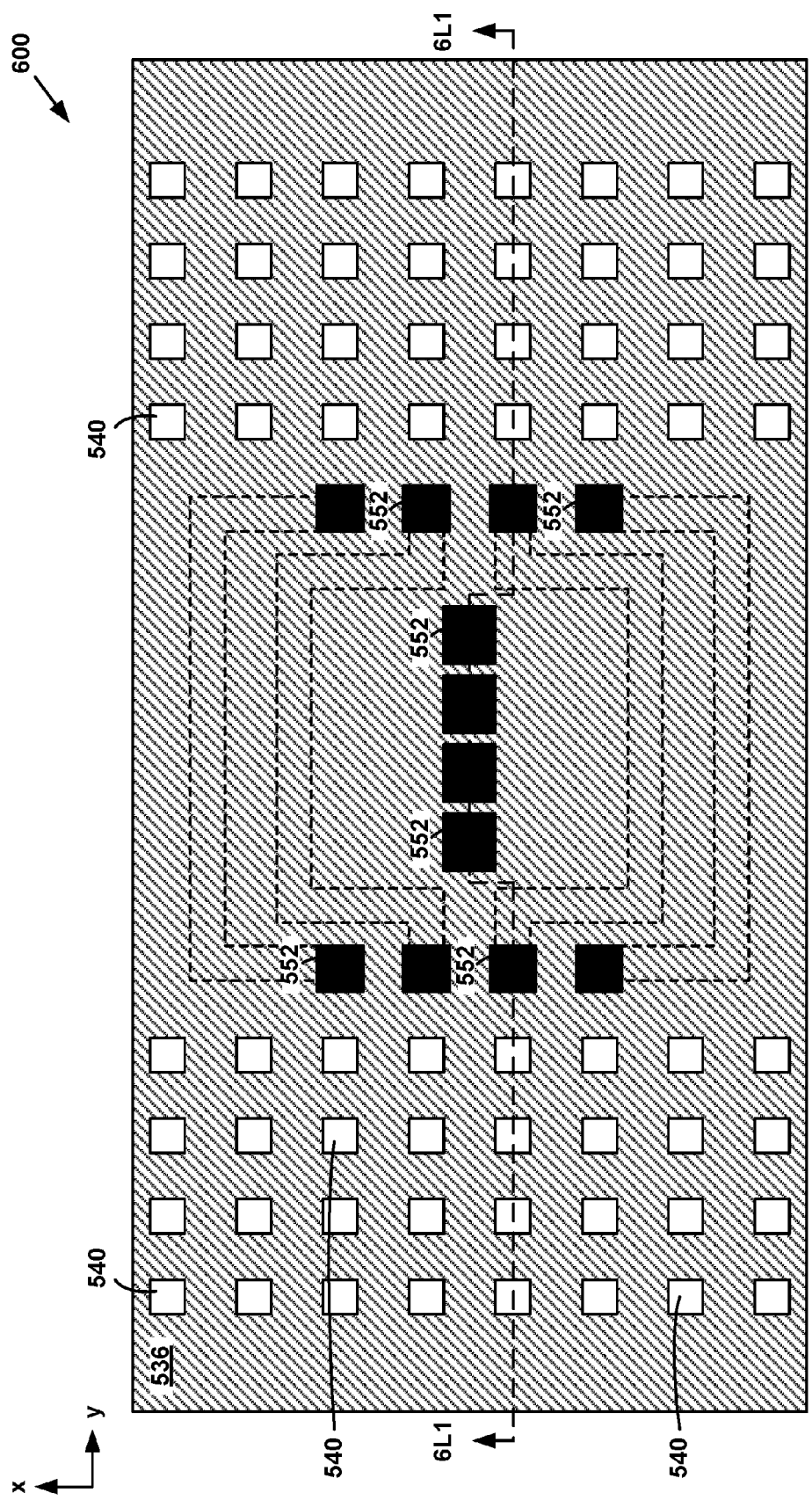
FIG. 6L2

MONOLITHIC THREE DIMENSIONAL MEMORY ARRAYS FORMED USING SACRIFICIAL POLYSILICON PILLARS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics, reduced memory cell sensing currents, and increased bit line settling times.

BRIEF DESCRIPTION OF THE DRAWINGS

FIGS. 6A-6L2 are cross-sectional views of a portion of a substrate during an example fabrication of the monolithic three-dimensional memory array of FIGS. 5A-5D.

DETAILED DESCRIPTION

Figure 1A:
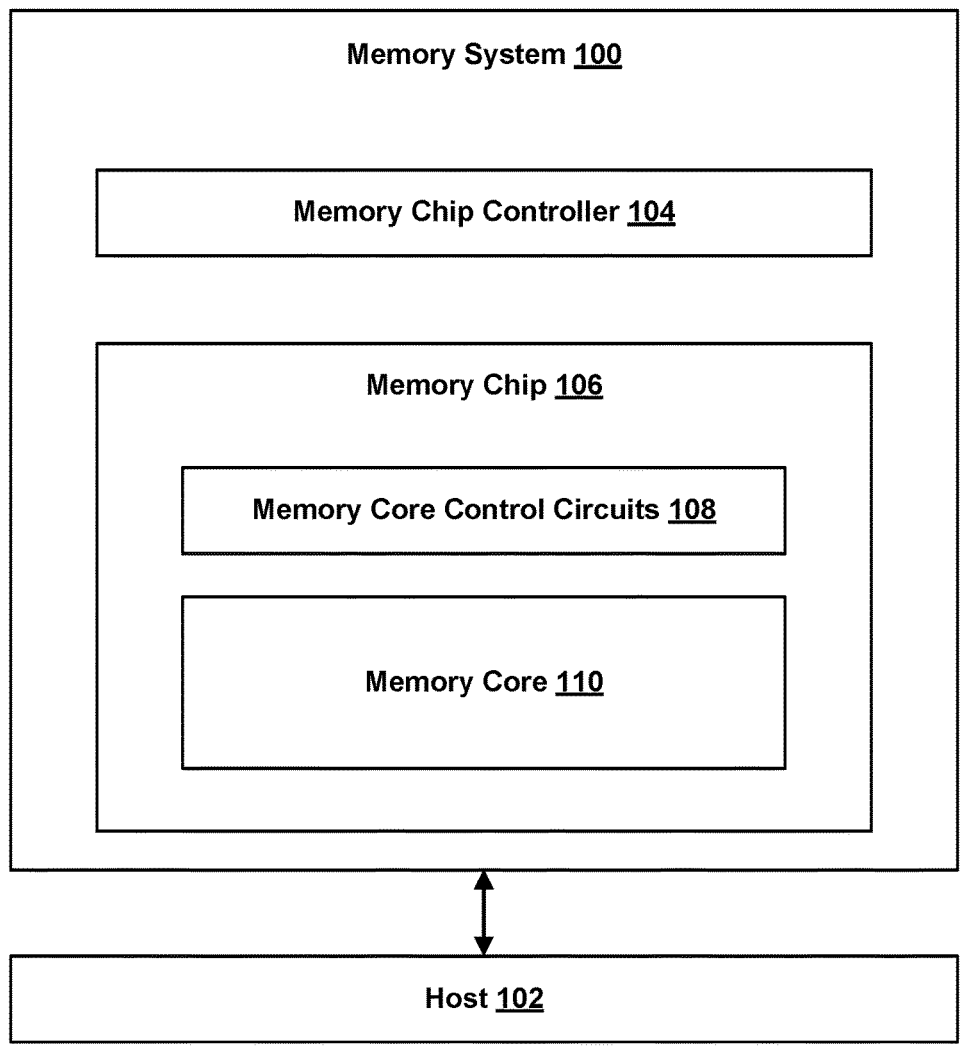
FIG. 1A depicts an embodiment of a memory system and a host.

Technology is described for monolithic three-dimensional memory arrays. In particular, conductive vias are formed by using sacrificial polysilicon pillars. In particular, sacrificial vertically-oriented polysilicon pillars are formed while forming vertically oriented polysilicon pillars that will be used as vertically-oriented bit line select transistors. The sacrificial vertically-oriented polysilicon pillars are removed to form voids. Conductive material is deposited in the voids to form vias. The vias may be used to form vertical conductive connections between material layers of the monolithic three-dimensional memory arrays.

For example, a row select line may include a first portion and a second portion, with the first portion of the row select line separated from the second portion of the row select line by a distance. In an embodiment, a word line hookup area separates the first portion of the row select line separated from the second portion of the row select line. Vias, such as though described above using sacrificial vertically-oriented polysilicon pillars, may be used to electrically couple the first portion of the row select line to the second portion of the row select line.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, to reduce leakage currents. In cross-point memory arrays where the memory cells do not include an isolation element, controlling and minimizing leakage currents may be a significant issue, especially because leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In one embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
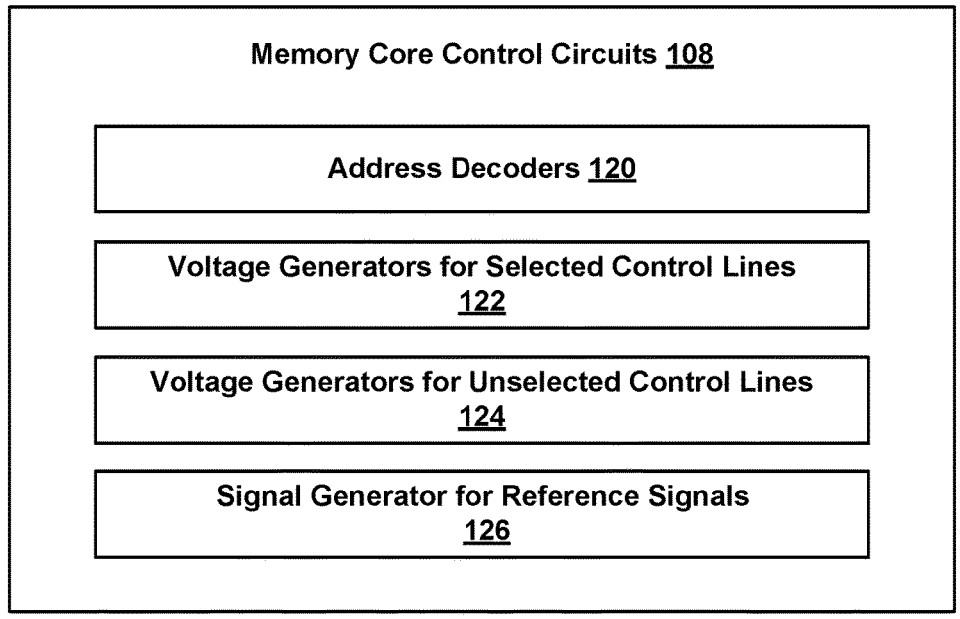
FIG. 1B depicts an embodiment of memory core control circuits.

FIG. 1B depicts one embodiment of memory core control circuits 108. As depicted, memory core control circuits 108 include address decoders 120, voltage generators for selected control lines 122, voltage generators for unselected control lines 124 and signal generators for reference signals 126 (described in more detail below). Control lines may include word lines, bit lines, or a combination of word lines and bit lines. Selected control lines may include selected word lines and/or selected bit lines that are used to place memory cells into a selected state. Unselected control lines may include unselected word lines and/or unselected bit lines that are used to place memory cells into an unselected state.

Address decoders 120 may generate memory block addresses, as well as row addresses and column addresses for a particular memory block. Voltage generators (or voltage regulators) for selected control lines 122 may include one or more voltage generators for generating selected control line voltages. Voltage generators for unselected control lines 124 may include one or more voltage generators for generating unselected control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
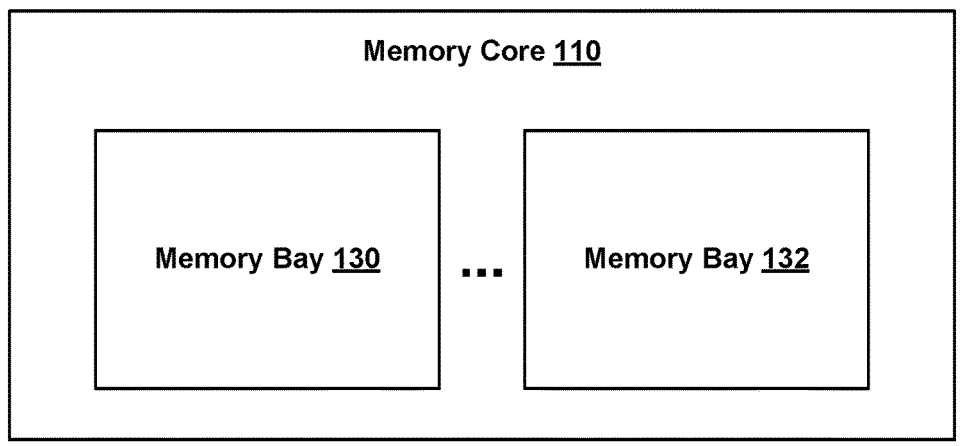
FIG. 1C depicts an embodiment of a memory core.

FIG. 1C depicts one embodiment of memory core 110 in FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 or other number of memory bays).

Figure 1D:
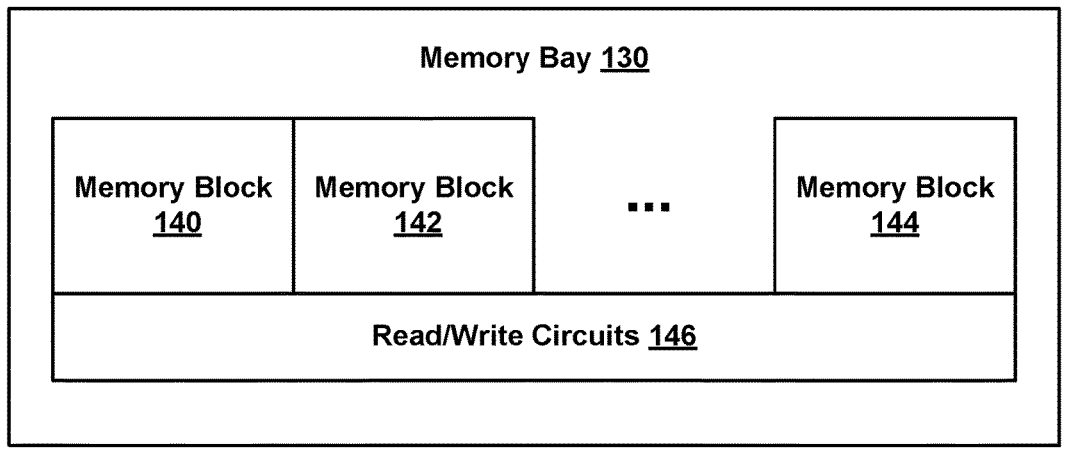
FIG. 1D depicts an embodiment of a memory bay.

FIG. 1D depicts one embodiment of memory bay 130 in FIG. 1C. As depicted, memory bay 130 includes memory blocks 140-144 and read/write circuits 146. In some embodiments, the number of memory blocks per memory bay may be different for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 in FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
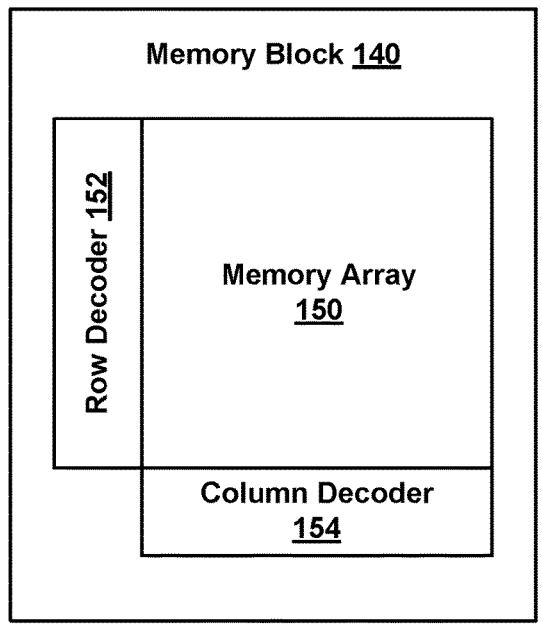
FIG. 1E depicts an embodiment of a memory block.

FIG. 1E depicts one embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M memory cells.

Figure 1F:
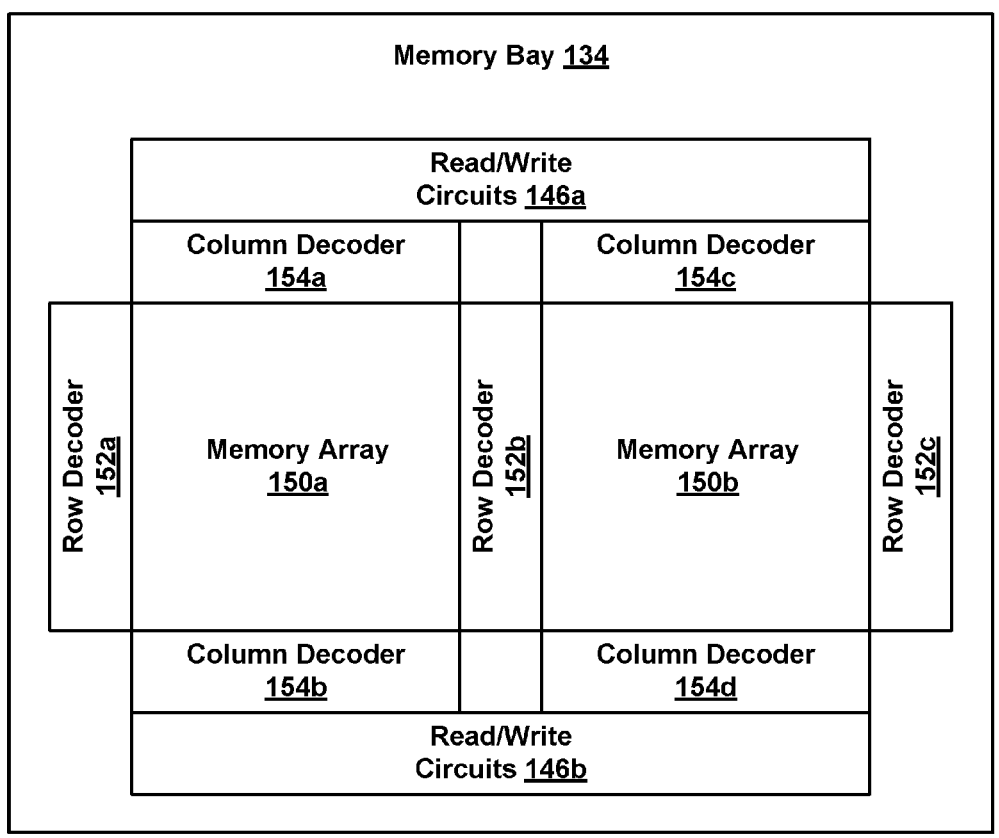
FIG. 1F depicts another embodiment of a memory bay.

FIG. 1F depicts one embodiment of a memory bay 134. Memory bay 134 is one example of an alternative implementation for memory bay 130 in FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
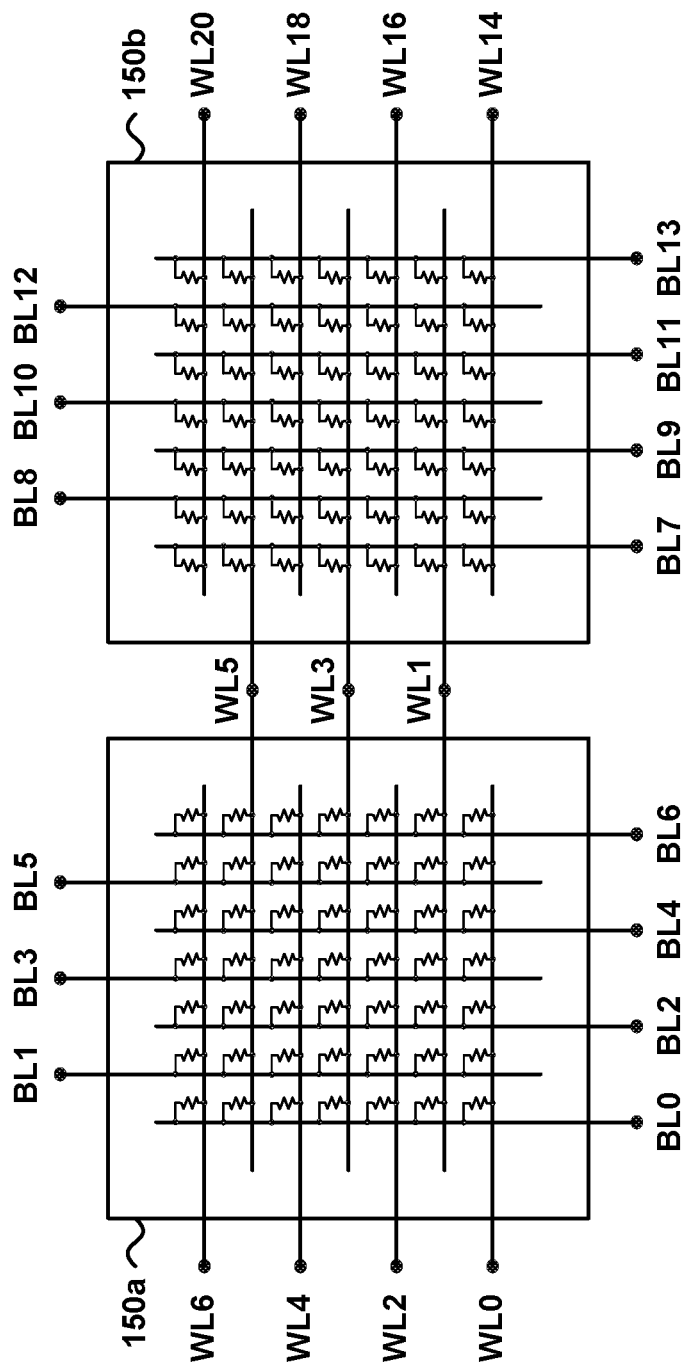
FIG. 2A depicts a schematic diagram of the memory bay of FIG. 1F.

FIG. 2A depicts one embodiment of a schematic diagram (including word lines and bit lines) corresponding with memory bay 134 in FIG. 1F. As depicted, word lines WL1, WL3, and WL5 are shared between memory arrays 150a and 150b and controlled by row decoder 152b of FIG. 1F. Word lines WL0, WL2, WL4, and WL6 are driven from the left side of memory array 150a and controlled by row decoder 152a of FIG. 1F. Word lines WL14, WL16, WL18, and WL20 are driven from the right side of memory array 150*b* and controlled by row decoder 152*c* of FIG. 1F.

Bit lines BL0, BL2, BL4, and BL6 are driven from the bottom of memory array 150*a* and controlled by column decoder 154*b* of FIG. 1F. Bit lines BL1, BL3, and BL5 are driven from the top of memory array 150*a* and controlled by column decoder 154*a* of FIG. 1F. Bit lines BL7, BL9, BL11, and BL13 are driven from the bottom of memory array 150*b* and controlled by column decoder 154*d* of FIG. 1F. Bit lines BL8, BL10, and BL12 are driven from the top of memory array 150*b* and controlled by column decoder 154*c* of FIG. 1F.

In one embodiment, memory arrays 150*a* and 150*b* may include memory layers that are oriented in a horizontal plane that is horizontal to the supporting substrate. In another embodiment, memory arrays 150*a* and 150*b* may include memory layers that are oriented in a vertical plane that is vertical with respect to the supporting substrate (i.e., the vertical plane is perpendicular to the supporting substrate).

Figure 2B:
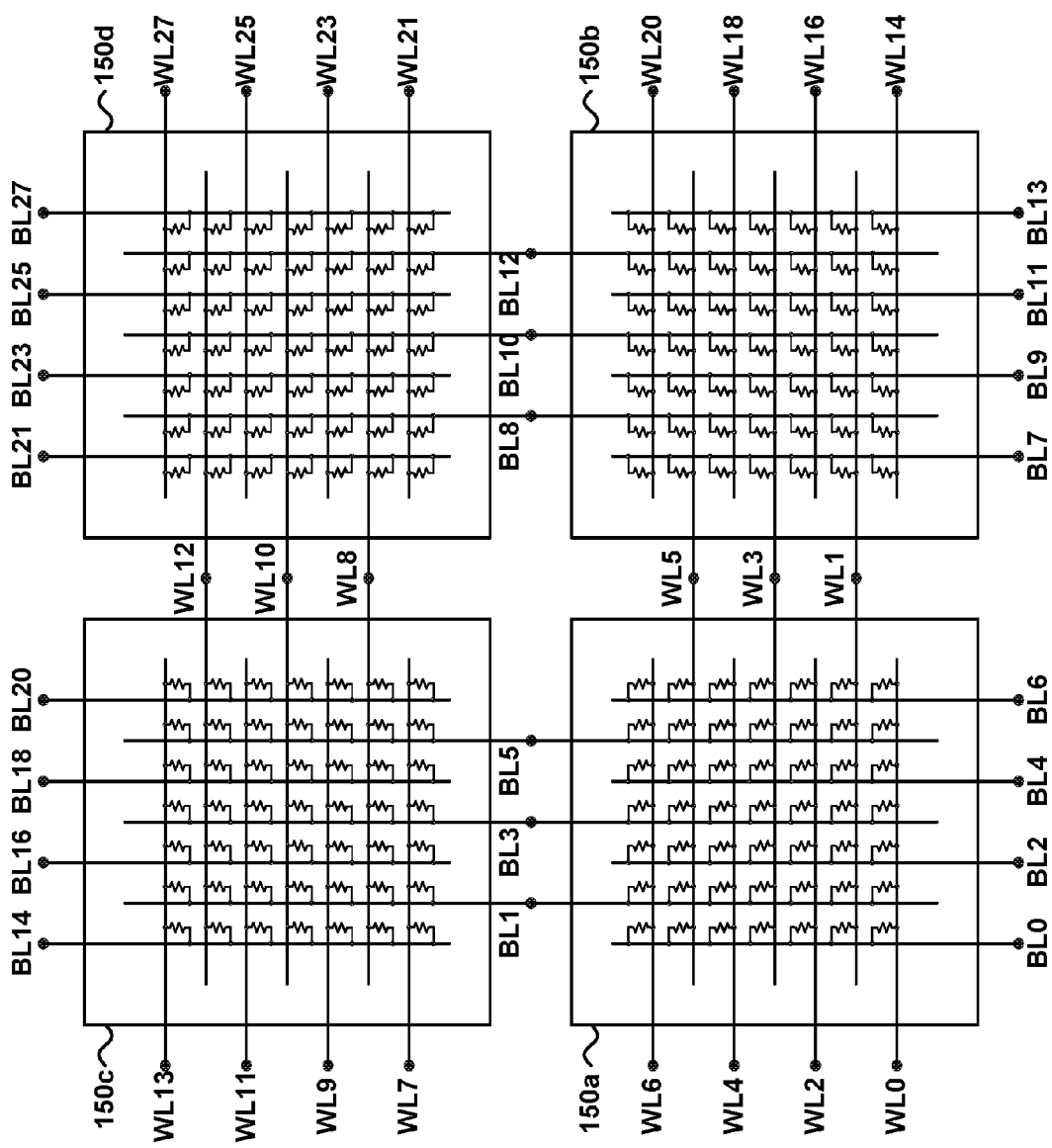
FIG. 2B depicts a schematic diagram of a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays.

As depicted, word lines WL1, WL3, and WL5 are shared between memory arrays 150*a* and 150*b*, and word lines WL8, WL10 and WL12 are shared between memory arrays 150*c* and 150*d*. Bit lines BL1, BL3, and BL5 are shared between memory arrays 150*a* and 150*c*, and bit lines BL8, BL10, and BL12 are shared between memory arrays 150*b* and 150*d*.

Row decoders are split such that word lines WL0, WL2, WL4, and WL6 are driven from the left side of memory array 150*a* and word lines WL1, WL3, and WL5 are driven from the right side of memory array 150*a*. Likewise, word lines WL7, WL9, WL11, and WL13 are driven from the left side of memory array 150*c* and word lines WL8, WL10, and WL12 are driven from the right side of memory array 150*c*.

Column decoders are split such that bit lines BL0, BL2, BL4, and BL6 are driven from the bottom of memory array 150*a* and bit lines BL1, BL3, and BL5 are driven from the top of memory array 150*a*. Likewise, bit lines BL21, BL23, BL25, and BL27 are driven from the top of memory array 150*d* and bit lines BL8, BL10, and BL12 are driven from the bottom of memory array 150*d*. Splitting row and/or column decoders also helps to relieve layout constraints (e.g., the column decoder pitch can be relieved by 2× since the split column decoders need only drive every other bit line instead of every bit line).

Figure 3A:
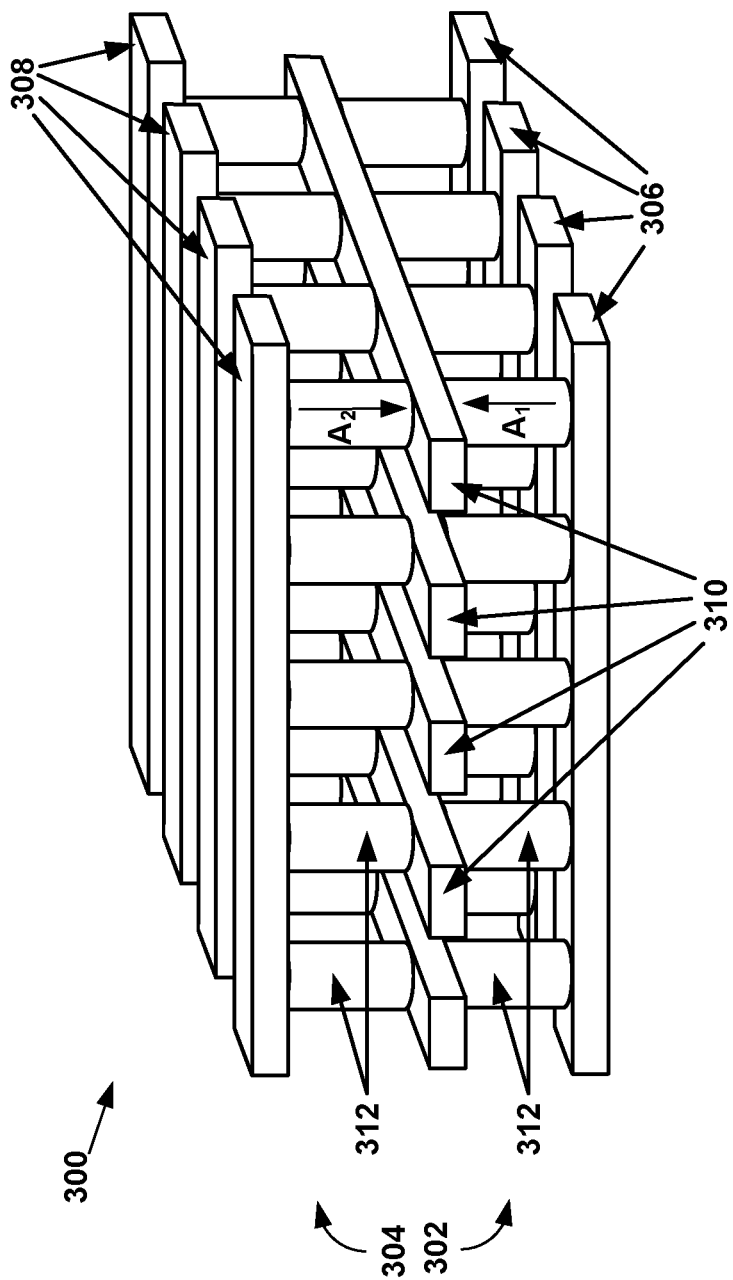
FIG. 3A depicts an embodiment of a portion of a monolithic three-dimensional memory array.

FIG. 3A depicts one embodiment of a portion of a monolithic three-dimensional memory array 300 that includes a first memory level 302 and a second memory level 304 positioned above first memory level 302. Memory array 300 is one example of an implementation for memory array 150 in FIG. 1E. Bit lines 306 and 308 are arranged in a first direction and word lines 310 are arranged in a second direction perpendicular to the first direction. As depicted, the upper conductors of first memory level 302 may be used as the lower conductors of second memory level 304. In a memory array with additional layers of memory cells, there would be corresponding additional layers of bit lines and word lines.

Memory array 300 includes a plurality of memory cells 312. Memory cells 312 may include re-writeable memory cells, and may include non-volatile memory cells or volatile memory cells. With respect to first memory level 302, a first portion of memory cells 312 are between and connect to bit lines 306 and word lines 310. With respect to second memory level 304, a second portion of memory cells 312 are between and connect to bit lines 308 and word lines 310. In one embodiment, each memory cell 312 includes a steering element (e.g., a diode) and a memory element (i.e., a state change element).

In one example, the diodes of first memory level 302 may be upward pointing diodes as indicated by arrow $A_1$ (e.g., with p regions at the bottom of the diodes), whereas the diodes of second memory level 304 may be downward pointing diodes as indicated by arrow $A_2$ (e.g., with n regions at the bottom of the diodes), or vice versa. In another embodiment, each memory cell 312 includes only a state change element. The absence of a diode (or other steering element) from a memory cell may reduce the process complexity and costs associated with manufacturing a memory array.

In one embodiment, memory cells 312 include re-writable non-volatile memory cells including a reversible resistance-switching element. A reversible resistance-switching element may include a reversible resistance-switching material having a resistance that may be reversibly switched between two or more states. In one embodiment, the reversible resistance-switching material may include a metal oxide (e.g., a binary metal oxide). The metal oxide may include nickel oxide, hafnium oxide, or some other metal oxide material. In another embodiment, the reversible resistance-switching material may include a phase change material. The phase change material may include a chalcogenide material. In some cases, the re-writeable non-volatile memory cells may include resistive RAM (ReRAM) devices.

In another embodiment, memory cells 312 may include conductive bridge memory elements. A conductive bridge memory element also may be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

In one embodiment of a read operation, the data stored in one of the plurality of memory cells 312 may be read by biasing one of the word lines (i.e., the selected word line) to a selected word line voltage in read mode (e.g., 0V). A sense amplifier may then be used to bias a selected bit line connected to the selected memory cell to the selected bit line voltage in read mode (e.g., 1.0V). In some cases, to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V). However, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines.

However, the reduced voltage stress comes at the expense of increased leakage currents associated with the selected word line and the selected bit line. Before the selected word line voltage has been applied to the selected word line, the selected bit line voltage may be applied to the selected bit line, and a sense amplifier may then sense an auto zero amount of current through the selected memory bit line which is subtracted from the bit line current in a second current sensing when the selected word line voltage is applied to the selected word line. The leakage current may be subtracted out by using the auto zero current sensing.

In one embodiment of a write operation, the reversible resistance-switching material may be in an initial high-resistance state that is switchable to a low-resistance state upon application of a first voltage and/or current. Application of a second voltage and/or current may return the reversible resistance-switching material back to the high-resistance state. Alternatively, the reversible resistance-switching material may be in an initial low-resistance state that is reversibly switchable to a high-resistance state upon application of the appropriate voltage(s) and/or current(s).

When used in a memory cell, one resistance state may represent a binary data "0," and another resistance state may represent a binary data "1." In some cases, a memory cell may be considered to include more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistance state to a low-resistance state may be referred to as SETTING the reversible resistance-switching element. The process of switching the resistance from the low-resistance state to the high-resistance state may be referred to as RESETTING the reversible resistance-switching element. The high-resistance state may be associated with binary data "1" and the low-resistance state may be associated with binary data "0." In other embodiments, SETTING and RESETTING operations and/or the data encoding can be reversed. In some embodiments, the first time a resistance-switching element is SET may require a higher than normal programming voltage and may be referred to as a FORMING operation.

In one embodiment of a write operation, data may be written to one of the plurality of memory cells 312 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V).

In some cases, to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation to detect a write disturb.

Figure 3B:
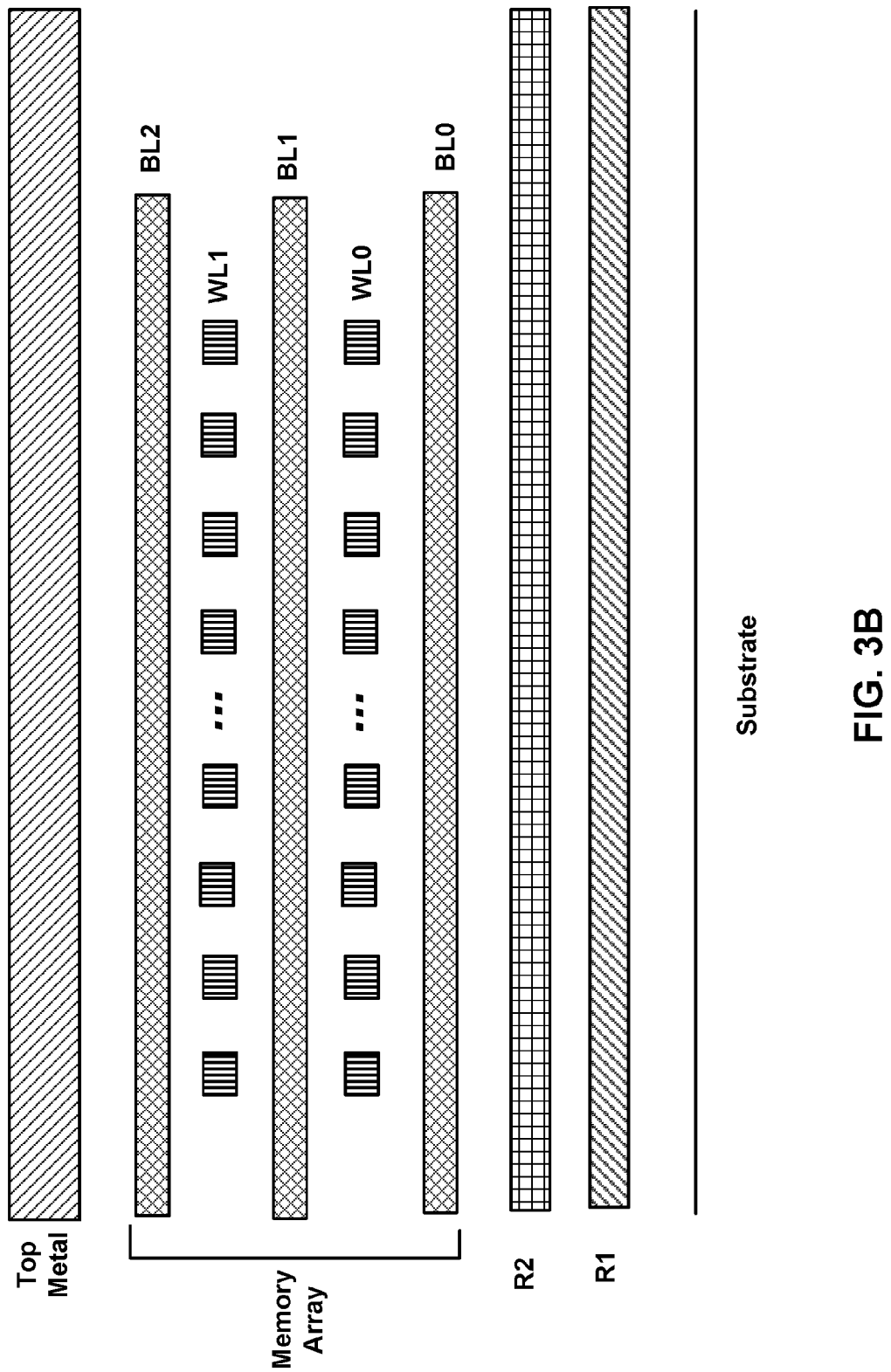
FIG. 3B depicts a subset of the memory array and routing layers of an embodiment of a three-dimensional memory array.

FIG. 3B depicts a subset of the memory array and routing layers of one embodiment of a three-dimensional memory array, such as memory array 150 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers also can be implemented. Supporting circuitry (e.g., row decoders, column decoders, and read/write circuits) may be arranged on the surface of the Substrate with the Memory Array layers fabricated above the supporting circuitry.

An integrated circuit implementing a three-dimensional memory array also may include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers. However, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
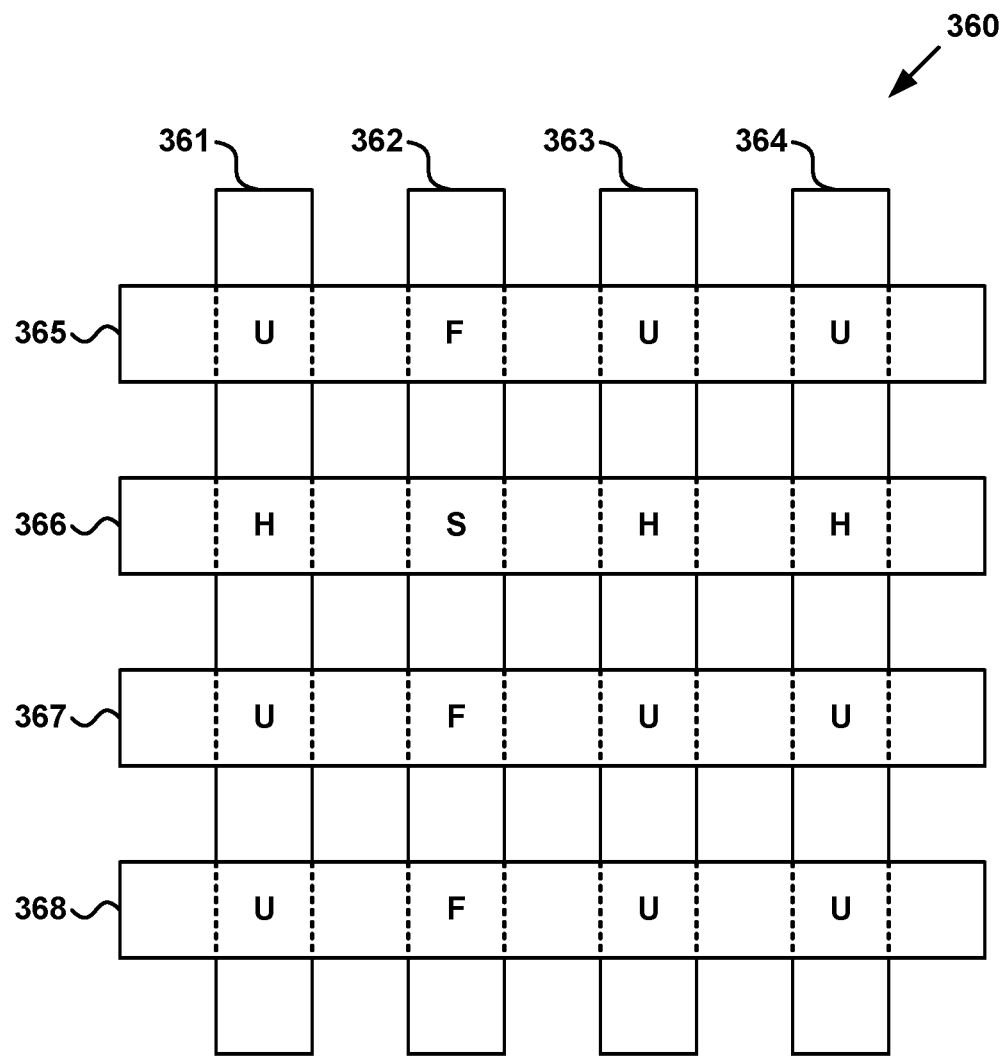
FIGS. 3C-3D depict various embodiments of a cross-point memory array.

FIG. 3C depicts one embodiment of a cross-point memory array 360. The cross-point memory array 360 may correspond with memory array 300 in FIG. 3A. As depicted, cross-point memory array 360 includes word lines 365-368 and bit lines 361-364. Word line 366 includes a selected word line and bit line 362 includes a selected bit line. At the intersection of selected word line 366 and selected bit line 362 is a selected memory cell (an S cell). The voltage across the S cell is the difference between the selected word line voltage and the selected bit line voltage.

Memory cells at the intersections of the selected word line 366 and the unselected bit lines 361, 363, and 364 include unselected memory cells (H cells). H cells are unselected memory cells that share a selected word line that is biased to the selected word line voltage. The voltage across the H cells is the difference between the selected word line voltage and the unselected bit line voltage.

Memory cells at the intersections of the selected bit line 362 and the unselected word lines 365, 367, and 368 include unselected memory cells (F cells). F cells are unselected memory cells that share a selected bit line that is biased to a selected bit line voltage. The voltage across the F cells is the difference between the unselected word line voltage and the selected bit line voltage.

Memory cells at the intersections of the unselected word lines 365, 367, and 368 and the unselected bit lines 361, 363, and 364 include unselected memory cells (U cells). The voltage across the U cells is the difference between the unselected word line voltage and the unselected bit line voltage.

The number of F cells is related to the length of the bit lines (or the number of memory cells connected to a bit line), whereas the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
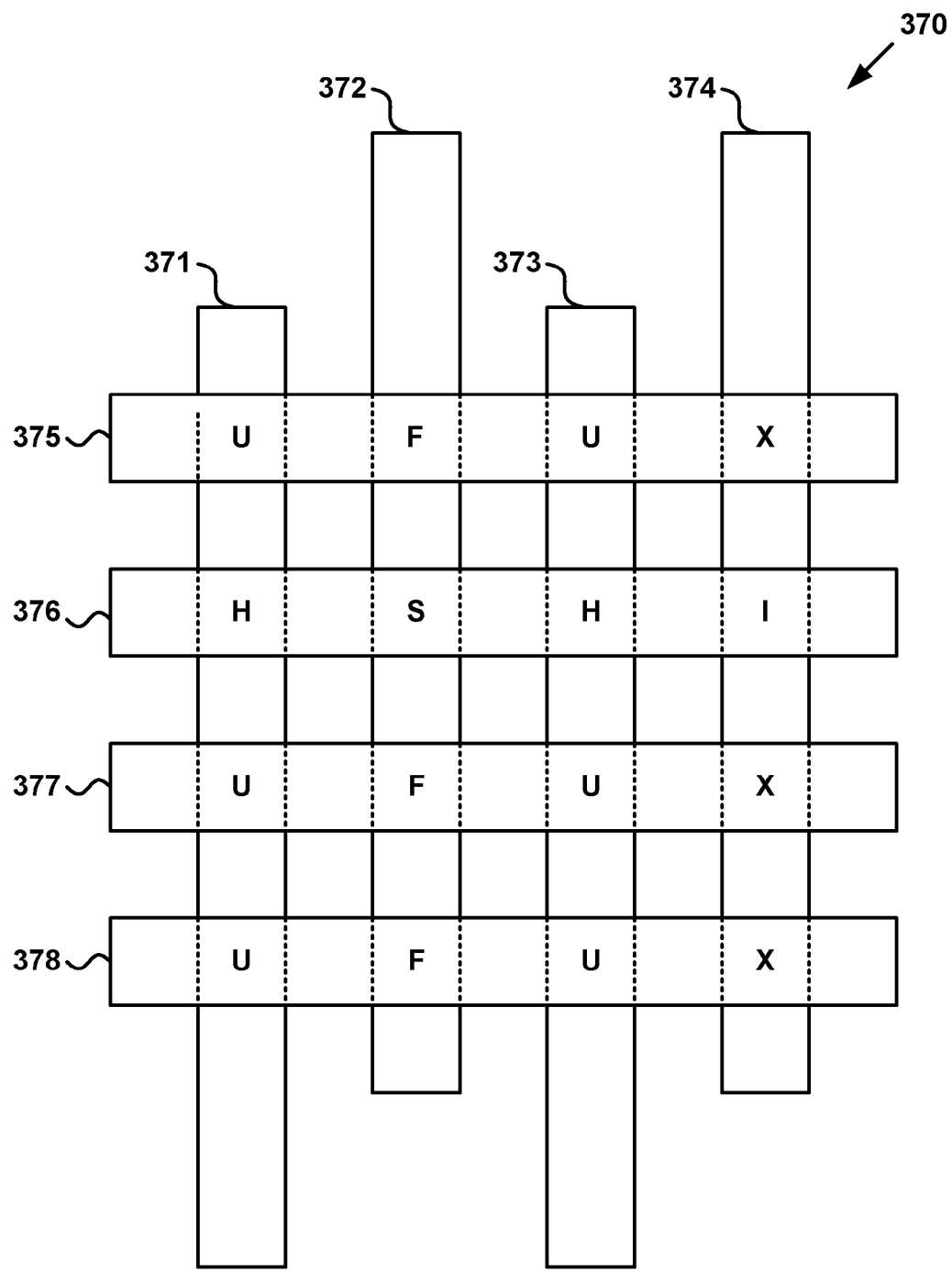

FIG. 3D depicts an alternative embodiment of a cross-point memory array 370. The cross-point memory array 370 may correspond with memory array 300 in FIG. 3A. As depicted, cross-point memory array 370 includes word lines 375-378 and bit lines 371-374. Word line 376 includes a selected word line and bit lines 372 and 374 include selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 include unselected memory cells (X cells). X cells are unselected memory cells that share a selected bit line that is biased to a program inhibit voltage. The voltage across the X cells is the difference between the unselected word line voltage and the program inhibit voltage.

In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may include H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may include resistive memory elements without isolating diodes. In one embodiment, the bit lines 372 and 373 may include vertical bit lines in a three dimensional memory array comprising comb shaped word lines.

Figure 4A:
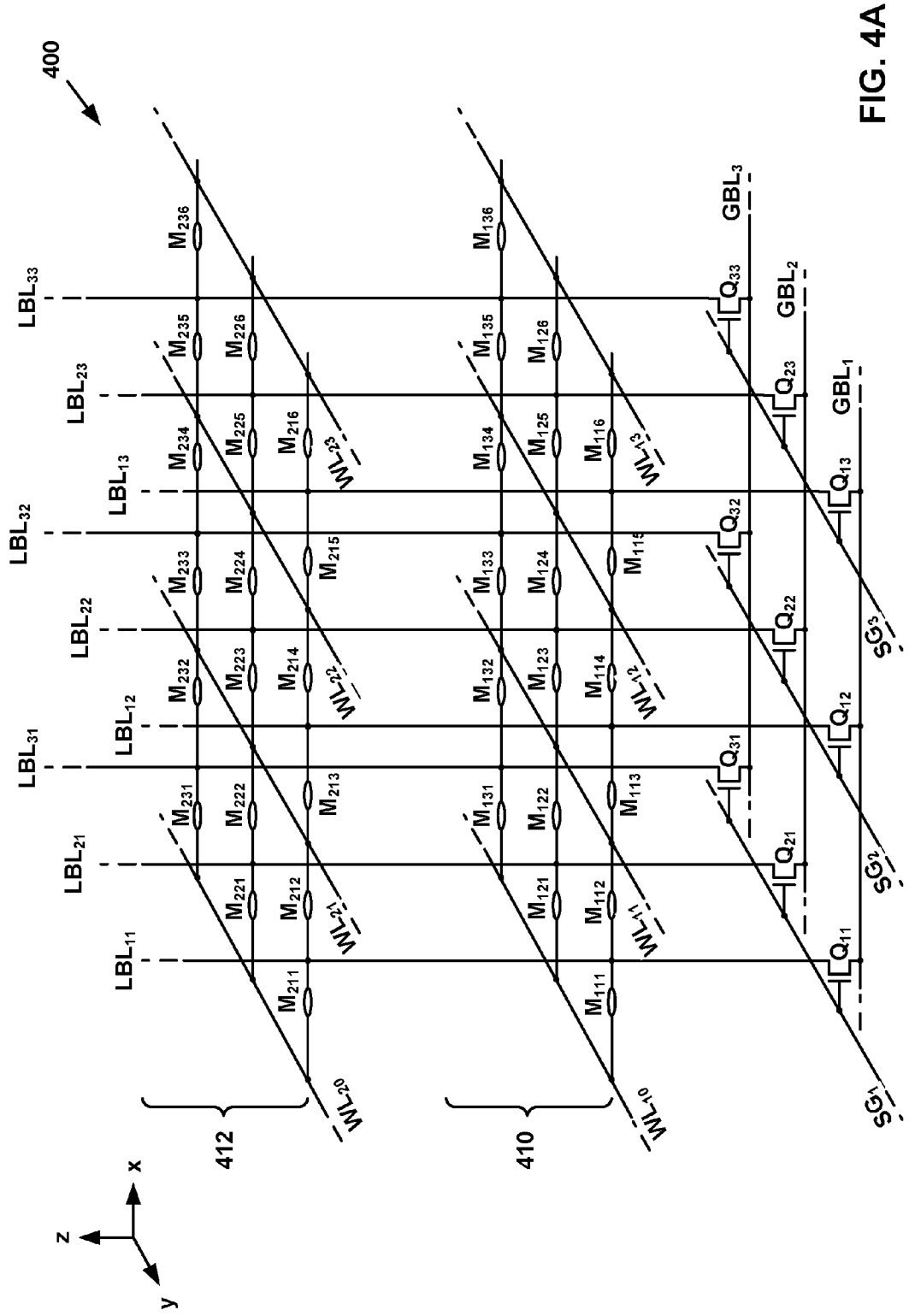
FIG. 4A depicts an embodiment of a portion of a monolithic three-dimensional memory array.

FIG. 4A depicts one embodiment of a portion of a monolithic three-dimensional memory array 400 that includes a first memory level 410, and a second memory level 412 positioned above first memory level 410. Memory array 400 is one example of an implementation for memory array 150 in FIG. 1E. Local bit lines $LBL_{11}$-$LBL_{33}$ are arranged in a first direction (e.g., a z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate device, a charge trap device (e.g., using a silicon nitride material), a reversible resistance-switching device, a ReRAM device, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{11}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$.

In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 400, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In one embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA, although other read currents may be used.

In one embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

Figure 4B:
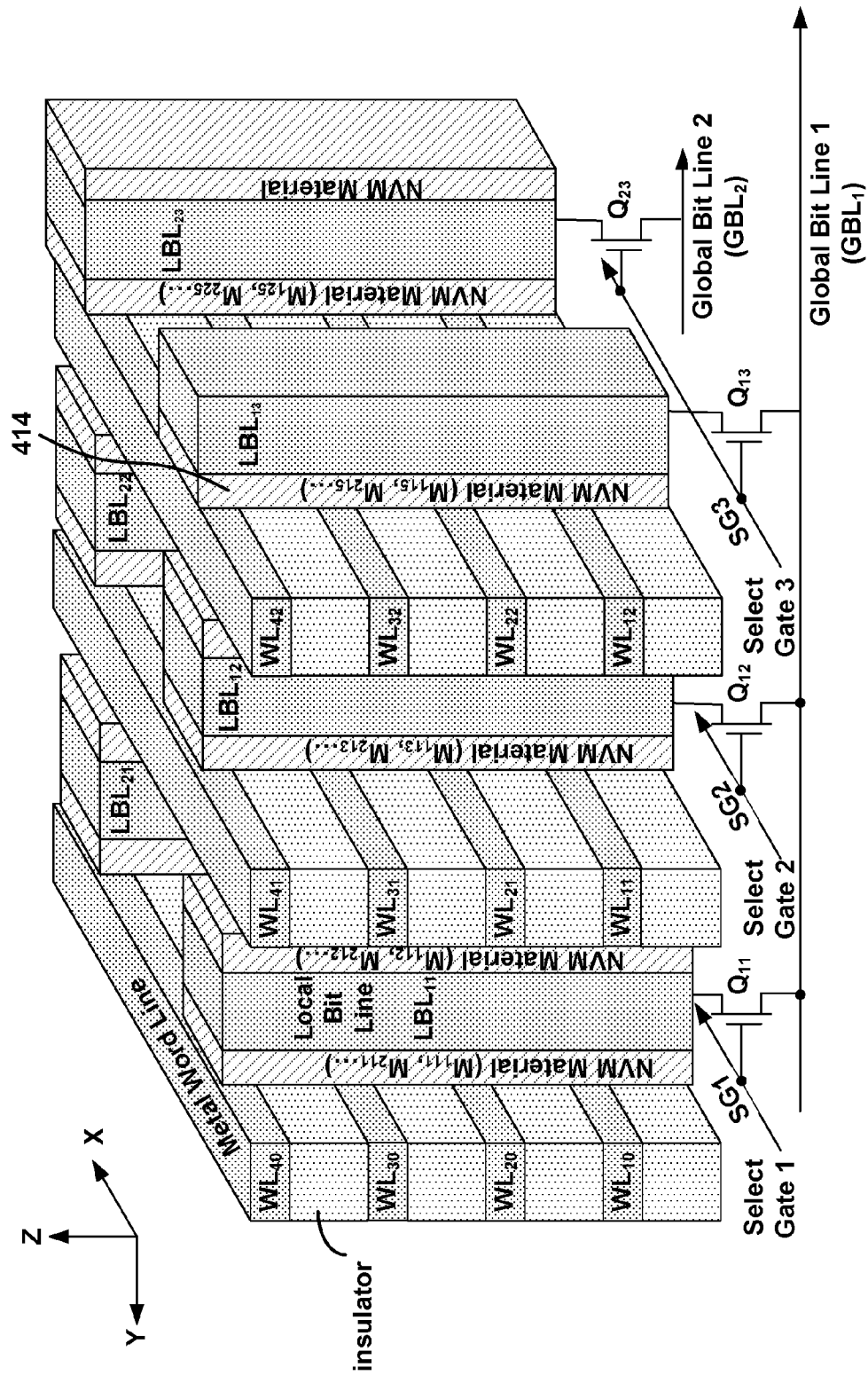
FIG. 4B depicts an embodiment of a portion of a monolithic three-dimensional memory array that includes vertical strips of a non-volatile memory material.

FIG. 4B depicts an embodiment of a portion of a monolithic three-dimensional memory array that includes vertical strips of a non-volatile memory material. The physical structure depicted in FIG. 4B may include one implementation for a portion of the monolithic three-dimensional memory array depicted in FIG. 4A. The vertical strips of non-volatile memory material may be formed in a direction that is perpendicular to a substrate (e.g., in the z-direction). A vertical strip of the non-volatile memory material 414 may include, for example, a vertical oxide layer, a vertical reversible resistance-switching material (e.g., a metal oxide layer such as nickel oxide, hafnium oxide, or other similar metal oxide material, a phase change material or other similar reversible resistance-switching material), or a vertical charge trapping layer (e.g., a layer of silicon nitride). The vertical strip of material may include a single continuous layer of material that may be used by a plurality of memory cells or devices.

In one example, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

FIGS. 5A-5D depict various views of an embodiment of a portion of a monolithic three-dimensional memory array 500 that includes vertical strips of a non-volatile memory material. The physical structure depicted in FIGS. 5A-5D may include one implementation for a portion of the monolithic three-dimensional memory array depicted in FIG. 4A.

Monolithic three-dimensional memory array 500 includes vertical bit lines $LBL_{11}$-$LBL_{88}$ arranged in a first direction (e.g., a z-direction), word lines $WL_{10}$, $WL_{20}$, ..., $WL_{615}$ arranged in a second direction (e.g., an x-direction) perpendicular to the first direction, row select lines $SG_1$, $SG_2$, ..., $SG_8$ arranged in the second direction, and global bit lines $GBL_1$, $GBL_2$, ..., $GBL_8$ arranged in a third direction (e.g., a y-direction) perpendicular to the first and second directions. Vertical bit lines $LBL_{11}$-$LBL_{88}$ are disposed above global bit lines $GBL_1$, $GBL_2$, ..., $GBL_8$, which each have a long axis in the second (e.g., x-direction).

In an embodiment, global bit lines $GBL_1$, $GBL_2$, ..., $GBL_8$ are disposed above a substrate 502, such as a silicon, germanium, silicon-germanium, undoped, doped, bulk, silicon-on-insulator ("SOI") or other substrate with or without additional circuitry. In an embodiment, an isolation layer 504, such as a layer of silicon dioxide, silicon nitride, silicon oxynitride or any other suitable insulating layer, is formed above substrate 502. In an embodiment, dielectric layers 506 and 508 (e.g., silicon dioxide) are formed above isolation layer 504, and global bit lines $GBL_1$, $GBL_2$, ..., $GBL_8$ are disposed above dielectric layer 508.

A memory cell is disposed between the intersection of each vertical bit line and each word line (e.g., memory cell $M_{1114}$ is disposed between vertical bit line $LBL_{17}$ and word line $WL_{113}$, and memory cell $M_{419}$ is disposed between vertical bit line $LBL_{15}$ and word line $WL_{48}$). Each memory cell may include a floating gate device, a charge trap device (e.g., using a silicon nitride material), a resistive change memory device, or other type of memory device. Vertically-oriented bit line select transistors $Q_{11}$-$Q_{88}$ may be used to select a corresponding one of vertical bit lines $LBL_{11}$-$LBL_{88}$. Vertically-oriented bit line select transistors $Q_{11}$-$Q_{88}$ may be field effect transistors, although other transistors types may be used.

Each of vertically-oriented bit line select transistors $Q_{11}$-$Q_{88}$ has a first terminal (e.g., a drain/source terminal), a second terminal (e.g., a source/drain terminal), a first control terminal (e.g., a first gate terminal) and a second control terminal (e.g., a second gate terminal). The first gate terminal and the second gate terminal may be disposed on opposite sides of the vertically-oriented bit line select transistor. The first gate terminal may be used to selectively induce a first conductive channel between the first terminal and the second terminal of the transistor, and the second gate terminal may be used to selectively induce a second conductive channel between the first terminal and the second terminal of the transistor.

In an embodiment, the first gate terminal and the second gate terminal are coupled together to form a single control terminal that may be used to collectively turn ON and OFF the vertically-oriented bit line select transistor. Thus, the first gate terminal and the second gate terminal of each of vertically-oriented bit line select transistors $Q_{11}$-$Q_{88}$ may be used to select a corresponding one of vertical bit lines $LBL_{11}$, $LBL_{12}$, ..., $LBL_{88}$. Without wanting to be bound by any particular theory, for each of vertically-oriented bit line select transistors $Q_{11}$-$Q_{88}$, it is believed that the current drive capability of the transistor may be increased by using both the first gate terminal and the second gate terminal to turn ON the transistor. For simplicity, the first and second gate terminal of each of select transistors $Q_{11}$-$Q_{88}$ will be referred to as a single gate terminal.

Figure 5A:
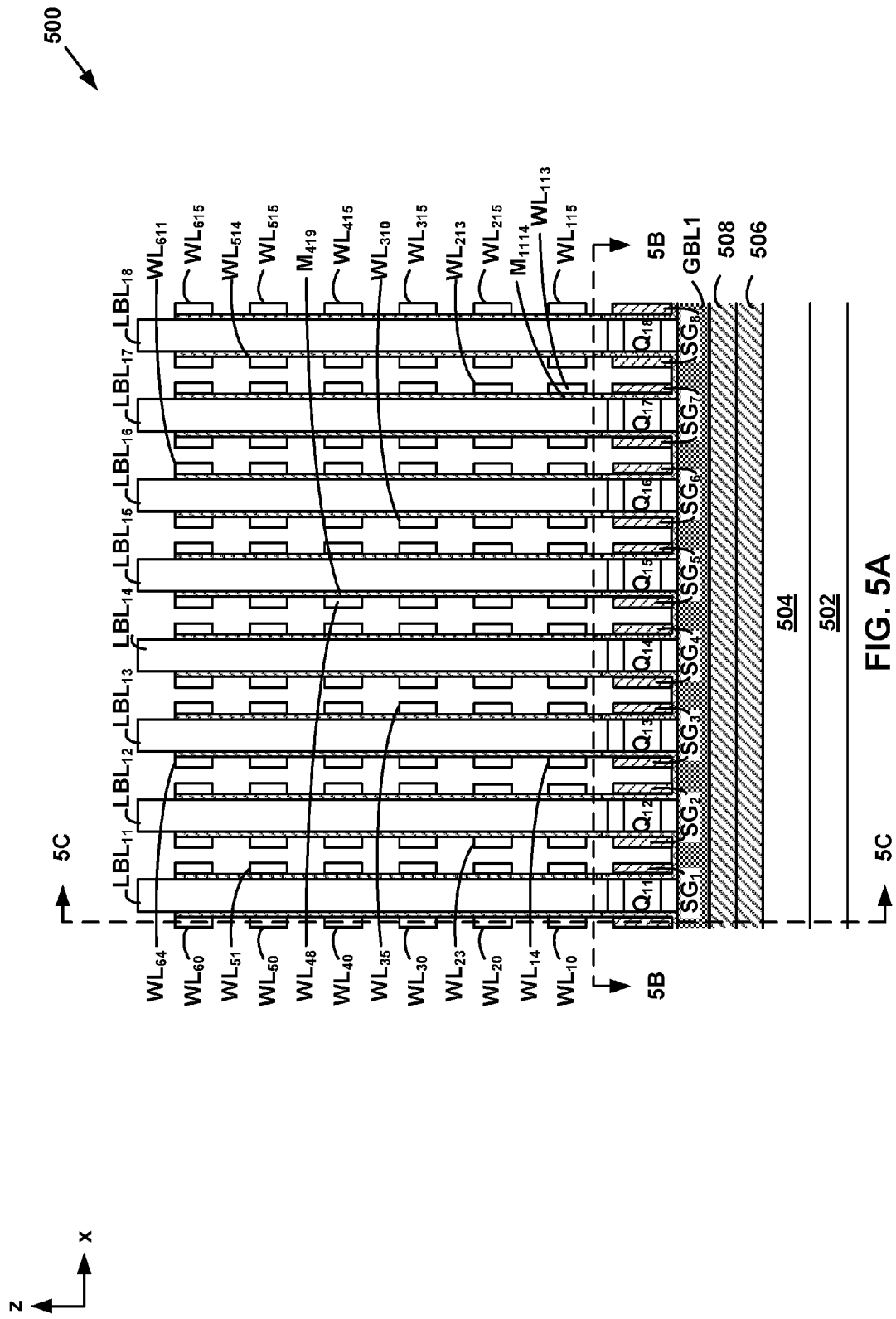
FIGS. 5A-5D depict various views of an embodiment monolithic three-dimensional memory array.

Referring to FIG. 5A, vertically-oriented bit line select transistors $Q_{11}$, $Q_{12}$, ..., $Q_{18}$ are used to selectively connect/disconnect vertical bit lines $LBL_{11}$, $LBL_{12}$, ..., $LBL_{18}$ to/from global bit line $GBL_1$ using row select lines $SG_1$, $SG_2$, ..., $SG_8$, respectively. In particular, each of vertically-oriented bit line select transistors $Q_{11}$, $Q_{12}$, ..., $Q_{18}$ has a first terminal (e.g., a drain./source terminal) coupled to a corresponding one of vertical bit lines $LBL_{11}$, $LBL_{12}$, ..., $LBL_{18}$, respectively, a second terminal (e.g., a source/drain terminal) coupled to global bit line $GBL_1$, and a control terminal (e.g., a gate terminal) coupled to row select line $SG_1$, $SG_2$, ..., $SG_8$, respectively. Row select lines $SG_1$, $SG_2$, ..., $SG_8$ are used to turn ON/OFF vertically-oriented bit line select transistors $Q_{11}$, $Q_{12}$, ..., $Q_{18}$, respectively, to connect/disconnect vertical bit lines $LBL_{11}$, $LBL_{12}$, ..., $LBL_{18}$, respectively, to/from global bit line $GBL_1$.

Figure 5B:
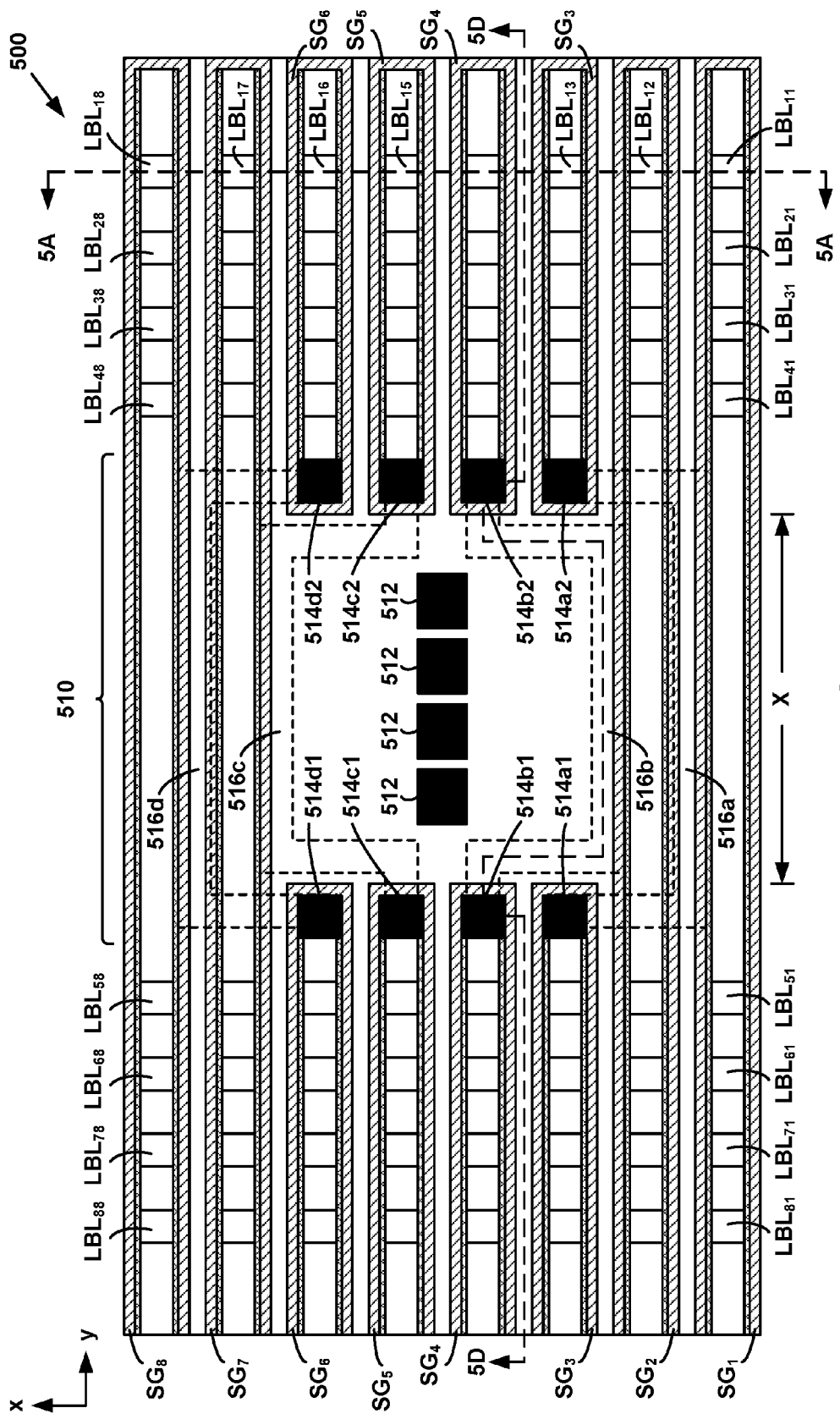
Figure 5C:
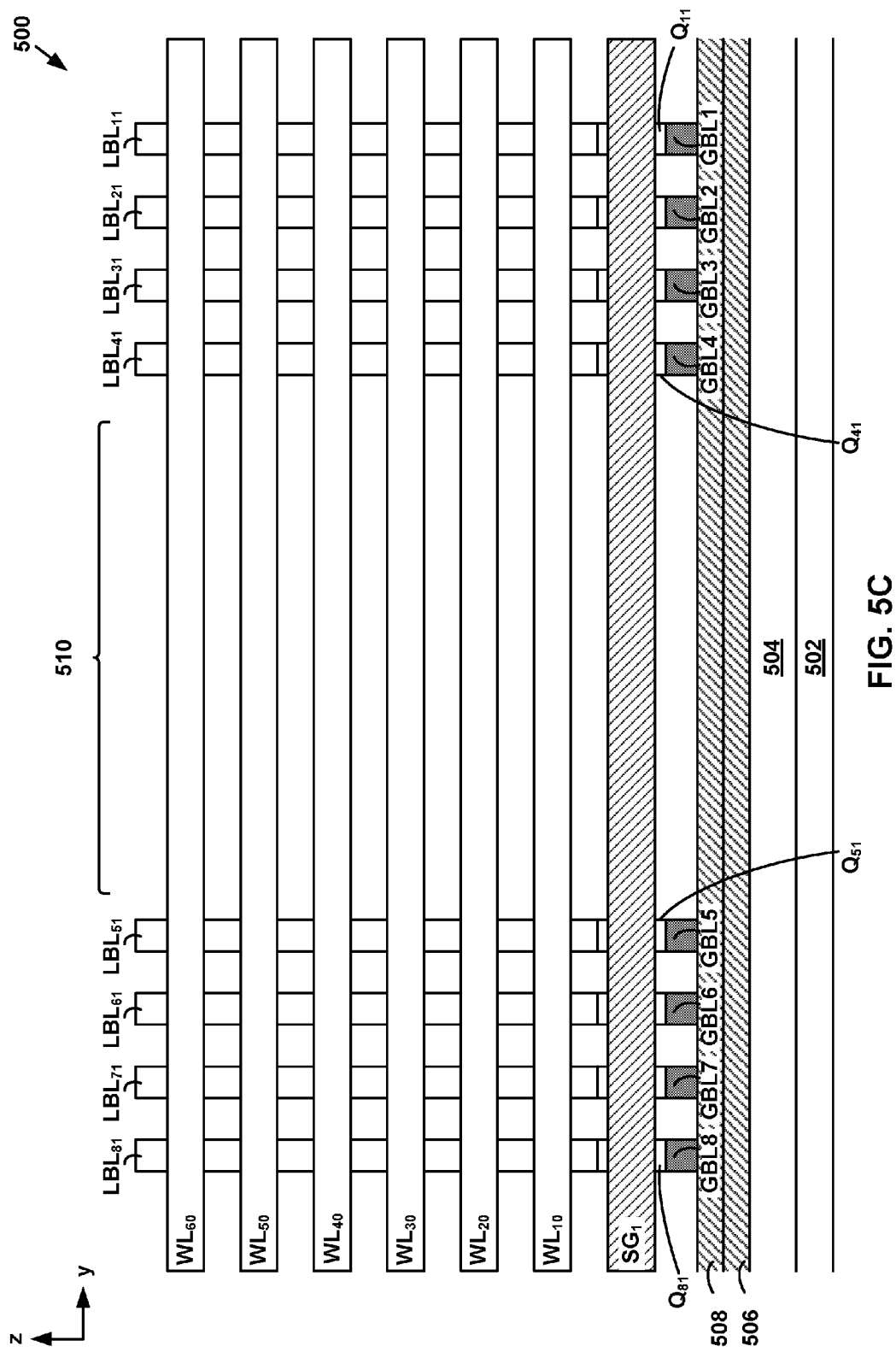

Likewise, referring to FIG. 5C, vertically-oriented bit line select transistors $Q_{11}$, $Q_{21}$, ..., $Q_{81}$ are used to selectively connect/disconnect vertical bit lines $LBL_{11}$, $LBL_{21}$, ..., $LBL_{81}$ to global bit lines $GBL_1$, $GBL_2$, ..., $GBL_8$, respectively, using row select line $SG_1$. In particular, each of vertically-oriented bit line select transistors $Q_{11}$, $Q_{21}$, ..., $Q_{81}$ has a first terminal (e.g., a drain./source terminal) coupled to a corresponding one of vertical bit lines $LBL_{11}$, $LBL_{23}$, ..., $LBL_{81}$, respectively, a second terminal (e.g., a source/drain terminal) coupled to a corresponding one of global bit lines $GBL_1$, $GBL_2$, ..., $GBL_8$, respectively, and a control terminal (e.g., a gate terminal) coupled to row select line $SG_1$. Row select line $SG_1$ are used to turn ON/OFF vertically-oriented bit line select transistors $Q_{11}$, $Q_{21}$, ..., $Q_{81}$ to connect/disconnect vertical bit lines $LBL_{11}$, $LBL_{21}$, ..., $LBL_{11}$, respectively, to/from global bit lines $GBL_1$, $GBL_2$, ..., $GBL_8$, respectively.

Figure 5D:
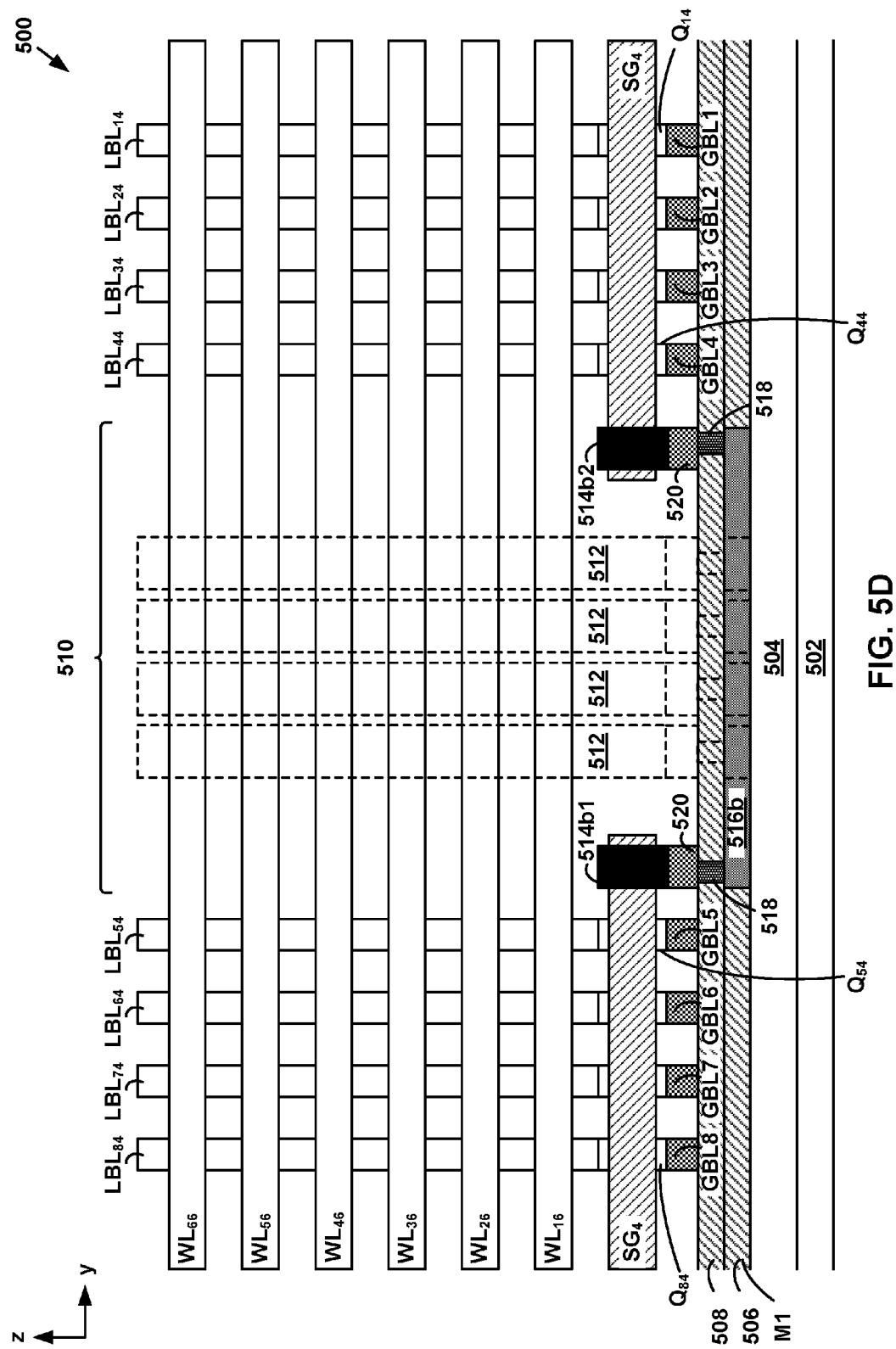
Figure 613:
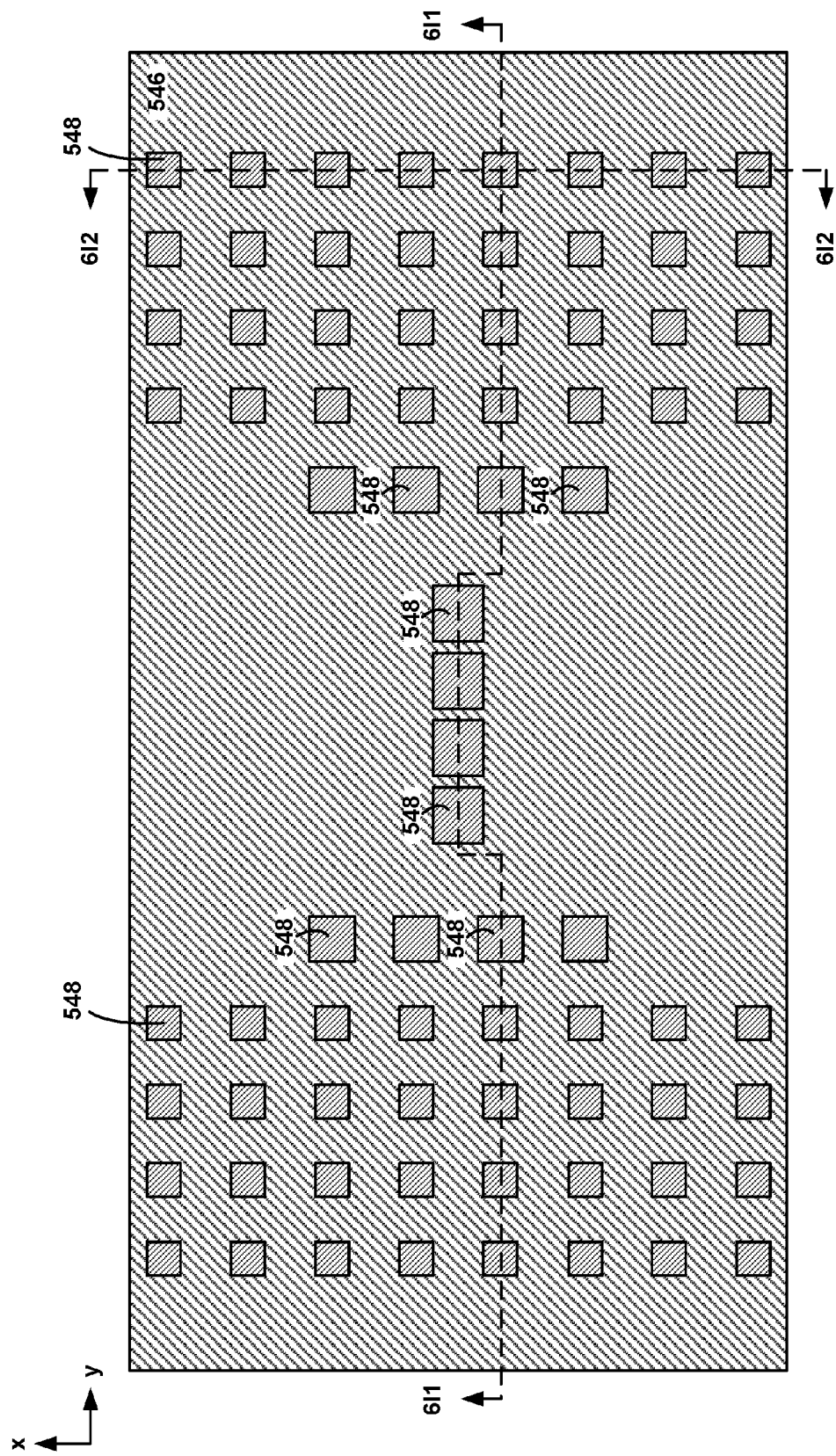

Similarly, referring to FIG. 5D, vertically-oriented bit line select transistors $Q_{14}$, $Q_{24}$, ..., $Q_{84}$ are used to selectively connect/disconnect vertical bit lines $LBL_{14}$, $LBL_{24}$, ..., $LBL_{84}$ to/from global bit lines $GBL_1$, $GBL_2$, ..., $GBL_8$, respectively, using row select line $SG_4$. In particular, each of vertically-oriented bit line select transistors $Q_{14}$, $Q_{24}$, ..., $Q_{84}$ has a first terminal (e.g., a drain./source terminal) coupled to a corresponding one of vertical bit lines $LBL_{14}$, $LBL_{24}$, ..., $LBL_{84}$, respectively, a second terminal (e.g., a source/drain terminal) coupled to a corresponding one of global bit lines $GBL_1$, $GBL_2$, ..., $GBL_8$, respectively, and a control terminal (e.g., a gate terminal) coupled to row select line $SG_4$. Row select line $SG_4$ are used to turn ON/OFF vertically-oriented bit line select transistors $Q_{14}$, $Q_{24}$, ..., $Q_{841}$ to connect/disconnect vertical bit lines $LBL_{14}$, $LBL_{24}$, ..., $LBL_{84}$, respectively, to/from global bit lines $GBL_1$, $GBL_2$, ..., $GBL_8$, respectively.

In an embodiment, monolithic three-dimensional memory array 500 includes a region 510 disposed between a first group of local bit lines (e.g., $LBL_{11}$, $LBL_{21}$, $LBL_{31}$, $LBL_{41}$, ..., $LBL_{18}$, $LBL_{28}$, $LBL_{38}$, $LBL_{48}$) and a second group of local bit lines (e.g., $LBL_{51}$, $LBL_{61}$, $LBL_{71}$, $LBL_{81}$, ..., $LBL_{68}$, $LBL6_{28}$, $LBL_{78}$, $LBL_{88}$). In an embodiment, region 510 includes vertical conductors 512 that extend in the first direction (e.g., z-direction). Vertical conductors 512 may be coupled to some or all of word lines $WL_{10}$, $WL_{20}$, ..., $WL_{615}$. Accordingly, region 510 also may be referred to as "word line hookup area 510."

As depicted in FIG. 5B, row select lines $SG_1$, $SG_2$, $SG_7$ and $SG_8$ extend in the third direction (e.g., y-direction) through word line hookup area 510. Row select lines $SG_3$, $SG_4$, $SG_5$ and $SG_6$ also extend in the y-direction, but do not extend through word line hookup area 510. Instead, each of row select lines $SG_3$, $SG_4$, $SG_5$ and $SG_6$ is divided into two portions, with first portions (depicted in FIG. 5B) to the left of word line hookup area 510, and second portions (depicted in FIG. 5B) to the right of word line hookup area 510. In an embodiment, first and second portions of row select lines $SG_3$, $SG_4$, $SG_5$ and $SG_6$ are separated by a distance X of between about 4500 angstroms and about 27000 angstroms.

In an embodiment, the first and second portions of each of row select lines $SG_3$, $SG_4$, $SG_5$ and $SG_6$ are connected to one another via vertical conductive pillars and conductive traces on a conductive layer (e.g., a metal layer M1) disposed under word line hookup area 510. In this regard, the first and second portions of each of row select lines $SG_3$, $SG_4$, $SG_5$ and $SG_6$ are coupled together without extending through word line hookup area 510.

For example, as shown in FIG. 5B, conductive pillar 514a1, conductive trace 516a and conductive pillar 514a2 couple together the first and second portions of row select lines $SG_3$. Likewise, as shown in FIGS. 5A and 5D, conductive pillar 514b1, conductive trace 516b and conductive pillar 514b2 couple together the first and second portions of row select lines $SG_4$. Similarly, as shown in FIG. 5A, conductive pillar 514c1, conductive trace 516c and conductive pillar 514c2 couple together the first and second portions of row select lines $SG_5$, and conductive pillar 514d1, conductive trace 516d and conductive pillar 514d2 couple together the first and second portions of row select lines $SG_6$.

As shown in FIG. 5D, in an embodiment, vias 518 and vias 520 may be used to connect conductive pillars 514b1 and 514b2 to conductive trace 516b. In an embodiment, vias 520 are formed in the global bit line layer, and vias 518 are formed in a layer between the global bit line layer and metal layer M1. Although not shown in FIGS. 5A-5D, similar vias 518 and vias 520 may be used to connect conductive pillars 514a1 and 514a2 to conductive trace 516a, connect conductive pillars 514c1 and 514c2 to conductive trace 516c, and connect conductive pillars 514d1 and 514d2 to conductive trace 516d. In another embodiment, conductive traces 516a-516d alternatively could be formed on the same level and using the same conductive material as global bit lines GBL1, GBL2, . . . , GBL8. Such an embodiment would eliminate the need for vias 518.

Referring now to FIGS. 6A-6L2, an example method of forming a monolithic three-dimensional memory array, such as monolithic three-dimensional array 500 of FIGS. 5A-5D, is described.

With reference to FIG. 6A, substrate 502 is shown as having already undergone several processing steps. Substrate 502 may be any suitable substrate such as a silicon, germanium, silicon-germanium, undoped, doped, bulk, silicon-on-insulator ("SOI") or other substrate with or without additional circuitry. For example, substrate 502 may include one or more n-well or p-well regions (not shown). Isolation layer 504 is formed above substrate 502. In some embodiments, isolation layer 504 may be a layer of silicon dioxide, silicon nitride, silicon oxynitride or any other suitable insulating layer.

Following formation of isolation layer 504, a conductive layer 505 is deposited over isolation layer 504. Conductive layer 505 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 505 may comprise between about 200 and about 2500 angstroms of tungsten. Other conductive layer materials and/or thicknesses may be used. In some embodiments, an adhesion layer (not shown), such as titanium nitride or other similar adhesion layer material, may be disposed between isolation layer 504 and conductive layer 505, and/or between conductive layer 505 and subsequent vertically-oriented bit line select transistors layers.

Persons of ordinary skill in the art will understand that adhesion layers may be formed by PVD or another method on conductive layers. For example, adhesion layers may be between about 20 and about 500 angstroms, and in some embodiments about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. To simplify the figures, adhesion layers have not been depicted in any of FIGS. 6A-6L2. Persons of ordinary skill in the art will understand that such adhesion layers may be used.

Following formation of conductive layer 505, conductive layer 505 is patterned and etched. For example, conductive layer 505 may be patterned and etched using conventional lithography techniques, with a soft or hard mask, and wet or dry etch processing. In at least one embodiment, conductive layer 505 is patterned and etched to form conductive traces 516a-516e. Example widths for conductive traces 516a-516e and/or spacings between conductive traces 516a-516e range between about 480 angstroms and about 1000 angstroms, although other conductor widths and/or spacings may be used.

After conductive traces 516a-516e have been formed, a dielectric material layer 506 is formed over substrate 502 to fill the voids between conductive traces 516a-516e. For example, approximately 3000-7000 angstroms of silicon dioxide may be deposited on the substrate 502 and planarized using chemical mechanical polishing or an etchback process to form a planar surface 507, resulting in the structure shown in FIGS. 6B1-6B2. Planar surface 507 includes exposed top surfaces of conductive traces 516a-516e separated by dielectric material 506. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, conductive traces 516a-516e may be formed using a damascene process in which dielectric material layer 506 is formed, patterned and etched to create openings or voids for conductive traces 516a-516e. The openings or voids then may be filled with conductive layer 505 (and/or a conductive seed, conductive fill and/or barrier layer if needed). Conductive layer 505 then may be planarized to form planar surface 507.

Following planarization, vias 518 are formed, resulting in the structure shown in FIGS. 6C1-6C2. Vias 518 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, vias 518 may comprise between about 480 and about 1000 angstroms of highly doped polysilicon. Other conductive layer materials and/or thicknesses may be used. Example widths for vias 518 and/or spacings between vias 518 range between about 480 angstroms and about 1000 angstroms, although other via widths and/or spacings may be used. Although vias 518 are shown having a rectangular shape, other shapes may be used.

After vias 518 have been formed, a dielectric material layer 508 is formed over substrate 502 to fill the voids between vias 518. For example, approximately 3000-7000 angstroms of silicon dioxide may be deposited on the substrate 502 and planarized using chemical mechanical polishing or an etchback process. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, vias 518 may be formed using a damascene process in which dielectric material layer 508 is formed, patterned and etched to create openings or voids for vias 518. The openings or voids then may be filled with a conductive layer (and/or a conductive seed, conductive fill and/or barrier layer if needed, and then planarized.

Following planarization, global bit lines $GBL_1$, $GBL_2$, ..., $GBL_8$ and vias 520 are formed. For example, a conductive layer may deposited over substrate 502, and then be patterned and etched using conventional lithography techniques, with a soft or hard mask, and wet or dry etch processing, to form global bit lines $GBL_1$, $GBL_2$, ..., $GBL_8$ and vias 520. Example widths for global bit lines $GBL_1$, $GBL_2$, ..., $GBL_8$ and/or spacings between global bit lines $GBL_1$, $GBL_2$, ..., $GBL_8$ range between about 240 angstroms and about 1000 angstroms, although other conductor widths and/or spacings may be used. Example widths for vias 520 and/or spacings between vias 520 range between about 240 angstroms and about 1000 angstroms, although other via widths and/or spacings may be used. In an embodiment, vias 520 have a rectangular shape, other shapes may be used.

In an embodiment, global bit lines $GBL_1$, $GBL_2$, ..., $GBL_8$ and vias 520 are formed from a conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, global bit lines $GBL_1$, $GBL_2$, ..., $GBL_8$ and vias 520 comprise between about 240 and about 1000 angstroms of tungsten. Other conductive layer materials and/or thicknesses may be used.

After global bit lines $GBL_1$, $GBL_2$, ..., $GBL_8$ and vias 520 have been formed, a dielectric material layer 522 is formed over substrate 502 to fill the voids between global bit lines $GBL_1$, $GBL_2$, ..., $GBL_8$ and vias 520. For example, approximately 3000-7000 angstroms of silicon dioxide may be deposited on the substrate 502 and planarized using chemical mechanical polishing or an etchback process to form a planar surface 524, resulting in the structure shown in FIGS. 6D1-6D3. Planar surface 524 includes exposed top surfaces of global bit lines $GBL_1$, $GBL_2$, ..., $GBL_8$ and vias 520 separated by dielectric material 524. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, global bit lines $GBL_1$, $GBL_2$, ..., $GBL_8$ and vias 520 may be formed using a damascene process in which dielectric material layer 522 is formed, patterned and etched to create openings or voids for global bit lines $GBL_1$, $GBL_2$, ..., $GBL_8$ and vias 520. The openings or voids then may be filled with a conductive layer (and/or a conductive seed, conductive fill and/or barrier layer if needed, and then planarized.

Following planarization, the semiconductor material used to form vertically-oriented bit line select transistors $Q_{11}$-$Q_{88}$ is formed over planarized top surface 524 of substrate 502. In some embodiments, each vertically-oriented bit line select transistor is formed from a polycrystalline semiconductor material such as polysilicon, a polycrystalline silicon-germanium alloy, polygermanium or any other suitable material. Alternatively, vertically-oriented bit line select transistors $Q_{11}$-$Q_{88}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertically-oriented bit line select transistor may include a first region (e.g., n+ polysilicon), a second region (e.g., p polysilicon) and a third region (e.g., n+ polysilicon) to form drain/source, body, and source/drain regions, respectively, of a vertical FET. For example, a heavily doped n+ polysilicon layer 526 may be deposited on planarized top surface 524. In some embodiments, n+ polysilicon layer 526 is in an amorphous state as deposited. In other embodiments, n+ polysilicon layer 526 is in a polycrystalline state as deposited. CVD or another suitable process may be employed to deposit n+ polysilicon layer 526.

In an embodiment, n+ polysilicon layer 526 may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ polysilicon layer 526 may be doped in situ, for example, by flowing a donor gas during deposition. Other doping methods may be used (e.g., implantation).

After deposition of n+ silicon layer 526, a doped p-type silicon layer 528 may be formed over n+ polysilicon layer 526. P-type silicon may be either deposited and doped by ion implantation or may be doped in situ during deposition to form a p-type silicon layer 528. For example, an intrinsic silicon layer may be deposited on n+ polysilicon layer 526, and a blanket p-type implant may be employed to implant boron a predetermined depth within the intrinsic silicon layer. Example implantable molecular ions include $BF_2$, $BF_3$, B and the like. In some embodiments, an implant dose of about 1-10×$10^{13}$ ions/cm$^2$ may be employed. Other implant species and/or doses may be used. Further, in some embodiments, a diffusion process may be employed. In an embodiment, the resultant p-type silicon layer 528 has a thickness of from about 800 to about 4000 angstroms, although other p-type silicon layer sizes may be used.

Following formation of p-type silicon layer 528, a heavily doped n+ polysilicon layer 530 is deposited on p-type silicon layer 528. In some embodiments, n+ polysilicon layer 530 is in an amorphous state as deposited. In other embodiments, n+ polysilicon layer 530 is in a polycrystalline state as deposited. CVD or another suitable process may be employed to deposit n+ polysilicon layer 530.

In an embodiment, n+ polysilicon layer 530 may be formed, for example, from about 100 to about 500 angstroms of phosphorus or arsenic doped silicon having a doping concentration of about $10^{21}$ cm$^{-3}$. Other layer thicknesses, doping types and/or doping concentrations may be used. N+ polysilicon layer 530 may be doped in situ, for example, by flowing a donor gas during deposition. Other doping methods may be used (e.g., implantation). Persons of ordinary skill in the art will understand that silicon layers 526, 528 and 530 alternatively may be doped p+/n/p+, respectively, or may be doped with a single type of dopant to produce junctionless-FETs.

Following formation of n+ polysilicon layer 530, silicon layers 526, 528 and 530 are patterned and etched to form first etched rows 532 and second etched rows 534. For example, silicon layers 526, 528 and 530 may be patterned and etched using conventional lithography techniques, with wet or dry etch processing. In an embodiment, silicon layers 526, 528 and 530 are patterned and etched to form first etched rows 532 disposed above global bit lines $GBL_1$, $GBL_2$, ..., $GBL_8$, and second etched rows 534 disposed above vias 520.

As described in more detail below, first etched rows 532 will be used to form vertically-oriented bit line select transistors $Q_{11}$-$Q_{88}$, and second etched rows 534 will be used to form vertical conductors 512 and conductive pillars 514a1-514d2 of FIGS. 5A-5D. Each of first etched rows 532 and second etched rows 534 may have a square, rectangular or other shape each having a width of between about 240 angstroms and about 1000 angstroms, although other widths may be used.

Silicon layers 526, 528 and 530 may be patterned and etched in a single pattern/etch procedure or using separate pattern/etch steps. Any suitable masking and etching process may be used to form first etched rows 532 and second etched rows 534. For example, silicon layers 526, 528 and 530 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, first etched rows 532 and second etched rows 534 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

After first etched rows 532 and second etched rows 534 have been formed, a dielectric material layer 536 is formed over substrate 502 to fill the voids between first etched rows 532 and second etched rows 534. For example, approximately 3000-7000 angstroms of silicon dioxide may be deposited on the substrate 502 and planarized using chemical mechanical polishing or an etchback process to form a planar surface 538, resulting in the structure shown in FIGS. 6E1-6E3. Planar surface 538 includes exposed top surfaces of first etched rows 532 and second etched rows 534 separated by dielectric material 536. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In a second masking step, silicon layers 526, 528 and 530 are patterned and etched to form vertical transistor pillars 540 and sacrificial pillars 542. For example, silicon layers 526, 538 and 530 may be patterned and etched using conventional lithography techniques, with wet or dry etch processing. In an embodiment, silicon layers 526, 528 and 530 are patterned and etched to form vertical transistor pillars 540 and sacrificial pillars 542, resulting in the structure shown in FIGS. 6F1-6F3. Each of second etched cavities 616b may have a square, rectangular or other shape each having a width of between about 240 angstroms and about 1000 angstroms, and a length of between about 240 angstroms and about 1000 angstroms, although other widths and lengths may be used.

Silicon layers 526, 528 and 530 may be patterned and etched in a single pattern/etch procedure or using separate pattern/etch steps. Any suitable masking and etching process may be used to form vertical transistor pillars 540 and sacrificial pillars 542. For example, silicon layers 526, 528 and 530 may be patterned with about 1 to about 1.5 micron, more preferably about 1.2 to about 1.4 micron, of PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, vertical transistor pillars 540 and sacrificial pillars 542 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

A gate dielectric layer 544 is deposited conformally over substrate 502, and forms on sidewalls of vertical transistor pillars 540 and sacrificial pillars 542, resulting in the structure shown in FIGS. 6G1-6G3. For example, between about 30 angstroms to about 100 angstroms of silicon dioxide may be deposited. Other dielectric materials such as silicon nitride, silicon oxynitride, low K dielectrics, etc., and/or other dielectric material layer thicknesses may be used.

Gate electrode material is deposited over vertical transistor pillars 540 and sacrificial pillars 542 and gate dielectric layer 544 to fill the voids between vertical transistor pillars 540 and sacrificial pillars 542. For example, approximately 10 nm to about 20 nm of titanium nitride or other similar metal, a highly-doped semiconductor, such as n+ polysilicon, p+ polysilicon, or other similar conductive material may be deposited. The as-deposited gate electrode material is subsequently etched back to form row select lines $SG_1$, $SG_2$, ..., $SG_8$, resulting in the structure shown in FIGS. 6H1-6H3.

A dielectric material layer 546 is deposited over the recessed row select lines $SG_1$, $SG_2$, ..., $SG_8$. For example, approximately 5000 to about 8000 angstroms of silicon dioxide may be deposited and planarized using chemical mechanical polishing or an etch-back process. Other dielectric materials and/or thicknesses may be used. Dielectric material layer 546 is then patterned and etched to form voids above vertical transistor pillars 540 and sacrificial pillars 542, and then silicon nitride (or another etch stop material) is deposited over substrate 502 to fill the voids, forming silicon nitride plugs 548, resulting in the structure illustrated in FIGS. 6I1-6I3.

Next, silicon nitride plugs 548, sacrificial pillars 542 and gate dielectric layer 544 are removed in word line hookup area 510, creating voids 550, resulting in the structure illustrated in FIGS. 6J1-6J3. For example, an etch may be selectively applied to word line hookup area 510 to remove silicon nitride plugs 548, sacrificial pillars 542 and gate dielectric layer 544. The etch may be applied in one or more steps.

A conductive material is deposited over substrate 502, filling voids 550 to form conductive vias 552. For example, approximately 500 to about 3000 angstroms of tungsten may be deposited and planarized using chemical mechanical polishing or an etch-back process, resulting in the structure shown in FIGS. 6K1-6K2. Other conductive materials and/or thicknesses may be used.

Finally, a chemical mechanical polishing or an etch-back process is used to remove dielectric material 546, silicon nitride plugs 548 and portions of conductive vias 552, resulting in the structure shown in FIGS. 6L1-6L2. Further processing steps may be used to form word lines $WL_{10}$, $WL_{20}$, . . . , $WL_{615}$, vertical bit lines $LBL_{11}$, $LBL_{12}$, . . . , $LBL_{88}$, and memory cells above substrate 502, as known in the art, to form monolithic three-dimensional array 500 of FIGS. 5A-5D.

Without wanting to be bound by any particular theory, it is believed that the disclosed technology can reduce the area required for word line hookup area 510. For example, in an embodiment, word line hookup area 510 can be between about 0.2 $\mu m^2$ and about 2.8 $\mu m^2$.

In addition, without wanting to be bound by any particular theory, it is believed that the disclosed technology can substantially eliminate the risk of an electrical short between any of row select lines $SG_1$, $SG_2$, . . . , $SG_8$ and select gate and any of conductive pillars 514a1-514d2.

Thus, as described above, one embodiment of the disclosed technology includes a method for forming a monolithic three-dimensional memory array. The method includes forming a first vertically-oriented polysilicon pillar above a substrate, the first vertically-oriented polysilicon pillar surrounded by a dielectric material, removing the first vertically-oriented polysilicon pillar to form a first void in the dielectric material, and filling the first void with a conductive material to form a first via.

One embodiment of the disclosed technology includes forming a plurality of vertically-oriented polysilicon pillars above a substrate, each of the plurality of vertically-oriented polysilicon pillars surrounded by a dielectric material, the plurality of vertically-oriented polysilicon pillars comprising a first vertically-oriented polysilicon pillar and a second vertically-oriented polysilicon pillar, disposing a row select line adjacent the first vertically-oriented polysilicon pillar, removing the second vertically-oriented polysilicon pillar to form a void in the dielectric material, filling the void with a conductive material to form a first via, and coupling the row select line to the via.

One embodiment of the disclosed technology includes a method of forming a row select line for a monolithic three-dimensional memory array. The method includes forming a first portion of the row select line and a second portion of the row select line, the first portion of the row select line separated from the second portion of the row select line by a distance, forming a first via and a second via, coupling the first portion of the row select line to the first via, and coupling the second portion of the row select line to the second via. The first and second vias are formed by forming a first vertically-oriented polysilicon pillar and a second vertically-oriented polysilicon pillar above a substrate, each of the first vertically-oriented polysilicon pillar and the second vertically-oriented polysilicon pillar surrounded by a dielectric material, removing the first vertically-oriented polysilicon pillar to form a first void in the dielectric material, removing the second vertically-oriented polysilicon pillar to form a second void in the dielectric material, and filling the first void with a conductive material to form a first via and filling the second void with the conductive material to form a second via.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of forming a monolithic three-dimensional memory array, the method comprising:
    forming a first vertically-oriented polysilicon pillar above a substrate, the first vertically-oriented polysilicon pillar surrounded by a dielectric material;
    forming a first gate dielectric material on a sidewall of the first vertically-oriented polysilicon pillar;
    forming a first gate electrode on a sidewall of the first gate dielectric material;
    removing the first vertically-oriented polysilicon pillar and the first gate dielectric material to form a first void in the dielectric material; and
    filling the first void with a conductive material to form a first via, wherein the conductive material is coupled to the first gate electrode.

2. The method of claim 1, wherein the first vertically-oriented polysilicon pillar comprises a first region, a second region and a third region.

3. The method of claim 2, wherein the first region comprises n+ polysilicon, the second region comprises p+ polysilicon, and the third region comprises n+ polysilicon.

4. The method of claim 2, wherein the first region comprises p+ polysilicon, the second region comprises n+ polysilicon, and the third region comprises p+ polysilicon.

5. The method of claim 1, further comprising:
    forming a second vertically-oriented polysilicon pillar above the substrate, the second vertically-oriented polysilicon pillar surrounded by the dielectric material;
    forming a second gate dielectric material on a sidewall of the second vertically-oriented polysilicon pillar;
    forming a second gate electrode on a sidewall of the second gate dielectric material;
    removing the second vertically-oriented polysilicon pillar and the second gate dielectric material to form a second void in the dielectric material; and
    filling the second void with the conductive material to form a second via, wherein the conductive material is coupled to the second gate electrode.

6. The method of claim 5, wherein the second vertically-oriented polysilicon pillar comprises a first region, a second region and a third region.

7. The method of claim 6, wherein the first region comprises n+ polysilicon, the second region comprises p+ polysilicon, and the third region comprises n+ polysilicon.

8. The method of claim 6, wherein the first region comprises p+ polysilicon, the second region comprises n+ polysilicon, and the third region comprises p+ polysilicon.

9. The method of claim 5, further comprising:
forming a row select line comprising a first portion and a second portion, the first portion of the row select line separated from the second portion of the row select line by a distance; and
coupling the first portion of the row select line to the first via and coupling the second portion of the row select line to the second via.

10. The method of claim 9, wherein the distance is between about 4500 angstroms and about 27000 angstroms.

11. A method comprising:
forming a plurality of vertically-oriented polysilicon pillars above a substrate, each of the plurality of vertically-oriented polysilicon pillars surrounded by a dielectric material, the plurality of vertically-oriented polysilicon pillars comprising a first vertically-oriented polysilicon pillar and a second vertically-oriented polysilicon pillar;
disposing a row select line adjacent the first vertically-oriented polysilicon pillar;
removing the second vertically-oriented polysilicon pillar to form a void in the dielectric material;
filling the void with a conductive material to form a first via; and
coupling the row select line to the via.

12. The method of claim 11, wherein each of the plurality of vertically-oriented polysilicon pillars comprises a first region, a second region and a third region.

13. The method of claim 12, wherein the first region comprises n+ polysilicon, the second region comprises p+ polysilicon, and the third region comprises n+ polysilicon.

14. The method of claim 12, wherein the first region comprises p+ polysilicon, the second region comprises n+ polysilicon, and the third region comprises p+ polysilicon.

15. The method of claim 11, further comprising disposing a gate dielectric layer between the row select line and the first vertically-oriented polysilicon pillar.

16. A method of forming a row select line for a monolithic three-dimensional memory array, method comprising:
forming a first portion of the row select line and a second portion of the row select line, the first portion of the row select line separated from the second portion of the row select line by a distance;
forming a first via and a second via by:
forming a first vertically-oriented polysilicon pillar and a second vertically-oriented polysilicon pillar above a substrate, each of the first vertically-oriented polysilicon pillar and the second vertically-oriented polysilicon pillar surrounded by a dielectric material;
removing the first vertically-oriented polysilicon pillar to form a first void in the dielectric material;
removing the second vertically-oriented polysilicon pillar to form a second void in the dielectric material; and
filling the first void with a conductive material to form a first via and filling the second void with the conductive material to form a second via;
coupling the first portion of the row select line to the first via; and
coupling the second portion of the row select line to the second via.

17. The method of claim 16, wherein each of the first vertically-oriented polysilicon pillar and the second vertically-oriented polysilicon pillar comprises a first region, a second region and a third region.

18. The method of claim 17, wherein the first region comprises n+ polysilicon, the second region comprises p+ polysilicon, and the third region comprises n+ polysilicon.

19. The method of claim 17, wherein the first region comprises p+ polysilicon, the second region comprises n+ polysilicon, and the third region comprises p+ polysilicon.

20. The method of claim 16, further comprising forming a conductive trace coupling the first via and the second via.

* * * * *